United States Patent
Izumi

(10) Patent No.: US 7,583,091 B2
(45) Date of Patent: Sep. 1, 2009

(54) PRINTED CIRCUIT BOARD, AND BACKPLANE DATA TRANSMISSION METHOD

(75) Inventor: Futoshi Izumi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 220 days.

(21) Appl. No.: 11/789,238

(22) Filed: Apr. 24, 2007

(65) Prior Publication Data

US 2008/0042659 A1    Feb. 21, 2008

(30) Foreign Application Priority Data

Aug. 21, 2006    (JP) ............... 2006-224458

(51) Int. Cl.
  *G01R 27/04* (2006.01)
  *H04B 3/46* (2006.01)
(52) U.S. Cl. .............. 324/637; 324/642; 375/224
(58) Field of Classification Search ............. 324/637, 324/642
  See application file for complete search history.

(56) References Cited

U.S. PATENT DOCUMENTS

| | | | |
|---|---|---|---|
| 5,303,416 A * | 4/1994 | Morera ............. | 455/296 |
| 6,627,507 B2 * | 9/2003 | Yuan ............. | 438/379 |
| 7,112,971 B2 * | 9/2006 | Kohler et al. ............. | 324/643 |
| 2005/0091015 A1 * | 4/2005 | Adamian ............. | 703/2 |
| 2005/0201491 A1 * | 9/2005 | Wei ............. | 375/326 |

FOREIGN PATENT DOCUMENTS

JP    59-081928    5/1984

* cited by examiner

*Primary Examiner*—Timothy J Dole
*Assistant Examiner*—Jeff Natalini
(74) *Attorney, Agent, or Firm*—Katten Muchin Rosenman LLP

(57) ABSTRACT

In a receiving-side printed circuit board, a reflected-waveform analyzing unit analyzes a reflected wave generated in a transmission line on a backplane along with transmission of a signal from a transmitting-side printed circuit board, and acquires waveform data that indicates a waveform of the reflected wave. An input signal identifying unit calculates a size of the reflected wave that is currently received based on the waveform data and data on previously received signals. The input signal identifying unit corrects a threshold value by the calculated size, and identifies a state of a bit indicated by the signal from the transmitting-side printed circuit board.

5 Claims, 26 Drawing Sheets

FIG.7

| DELAY TIME | VOLTAGE LEVEL |
|---|---|
| 1 | 0 |
| 2 | 0 |
| 3 | 0 |
| 4 | 0 |
| 5 | 0 |
| 6 | 0 |
| 7 | 0 |
| 8 | 0 |
| 9 | 0 |
| 10 | 2 |
| 11 | 2 |
| 12 | 2 |
| 13 | 2 |
| 14 | 0 |
| 15 | 0 |
| 16 | 0 |
| 17 | 0 |
| 18 | 0 |
| 19 | 2 |
| 20 | 2 |
| 21 | 2 |
| ... | ... |

PRINTED CIRCUIT BOARD, AND BACKPLANE DATA TRANSMISSION METHOD

BACKGROUND OF THE INVENTION

1. Field of the Invention

The present invention relates to a printed circuit board on a backplane and a method of data transmission on the backplane.

2. Description of the Related Art

Recently, a processing speed of a data processor or a transmitter has been improved. A data transmission speed inside a device which is used to be several hundred megabits per second (Mbps) has increased to more than 1 Giga-bps. Due to the increase in the data transmission speed inside the device, a reflected wave that is generated along with data transmission causes a distortion of a signal waveform, resulting in a data transmission error.

If the data transmission speed is low, even if a reflected wave is generated in a transmission line in the device, the generated reflected wave falls within a 1-bit timeslot and does not affect timeslots of other bits. However, if the data transmission speed is increased and the 1-bit timeslot is reduced, the reflected wave affects the other timeslots. Due to this, a receiver of data is not able to correctly determine whether a bit is on or off.

Especially, in a data processor or a transmitter such as a blade server which includes a plurality of printed circuit boards connected through a backplane, the problem of reflected waves is significant. This is because a device having such a structure includes a connector for mounting a printed circuit board on a backplane therein. The connector is likely to generate a reflected wave due to impedance mismatch.

There are known technologies as disclosed in, for example, Japanese Patent Application Laid-open No. S59-081928 to reduce the influence of reflected waves by generating cancellation waves to cancel the reflected waves.

Depending on a configuration of a transmission line, reflected waves sometimes repeatedly travel back and forth in a predetermined section of the transmission line while attenuating and exerting influence on a plurality of bits. Moreover, if waveforms of the reflected waves and data transmission waveforms overlap many times, the waveforms of the reflected waves become large due to resonance. This may cause a significant data transmission error.

However, such characteristics of the reflected waves are not sufficiently taken into consideration in the conventional technologies for reducing the influence of the reflected waves. Consequently, the influence of the reflected waves in data transmission cannot be sufficiently eliminated.

SUMMARY OF THE INVENTION

It is an object of the present invention to at least partially solve the problems in the conventional technology.

According to an aspect of the present invention, a printed circuit board on a backplane that exchanges signals with another printed circuit board on the backplane via a transmission line, includes an analyzing unit that analyzes a reflected wave generated in the transmission line along with transmission of a signal from the other printed circuit board and obtains waveform data that indicates a waveform of the reflected wave, a calculating unit that calculates a size of the reflected wave based on the waveform data and data on previously received signals, and an identifying unit that corrects a threshold value by calculated size of the reflected wave and identifies a state of a bit indicated by the signal from the other printed circuit board.

According to another aspect of the present invention, a printed circuit board on a backplane that exchanges signals with another printed circuit board on the backplane via a transmission line, includes a controller that acquires, from the other printed circuit board, waveform data on a waveform of a reflected wave generated in the transmission line upon transmission of a signal to the other printed circuit board, a calculating unit that calculates a size of the reflected wave superimposed on a signal to be transmitted based on the waveform data and data on previously transmitted signals, and an output adjusting unit that adjusts an output level of the signal to be transmitted by calculated size of the reflected wave.

According to still another aspect of the present invention, a backplane data transmission method for exchange of signals between a first printed circuit board and a second printed circuit board via transmission line on a backplane, includes the first printed circuit board transmitting a signal of a single waveform to the second printed circuit board via the transmission line, the second printed circuit board analyzing a reflected wave generated in the transmission line along with the transmission of the signal to obtain waveform data that indicates a waveform of the reflected wave, the second printed circuit board calculating a size of the reflected wave based on the waveform data and data on previously received signals, the second printed circuit-board correcting a threshold value by calculated size of the reflected wave, and the second printed circuit board identifying a state of a bit indicated by the signal transmitted from the first printed circuit board.

According to still another aspect of the present invention, a backplane data transmission method for exchange of signals between a first printed circuit board and a second printed circuit board via a transmission line on a backplane, includes the first printed circuit board transmitting a signal of a single waveform to the second printed circuit board via the transmission line, the second printed circuit board analyzing a reflected wave generated in the transmission line along with the transmission of the signal to obtain waveform data that indicates a waveform of the reflected wave, the first printed circuit board calculating a size of the reflected wave superimposed on a signal to be transmitted based on the waveform data and data on previously transmitted signals, and the first printed circuit board adjusting an output level of the signal to be transmitted to the second printed circuit board by calculated size of the reflected wave.

According to still another aspect of the present invention, a backplane data transmission method for a printed circuit board on a backplane that exchanges signals with another printed circuit board on the backplane via a transmission line, includes acquiring, from the other printed circuit board, waveform data on a waveform of a reflected wave generated in the transmission line upon transmission of a signal to the other printed circuit board, generating a plurality of codes that represent a bit sequence to be transmitted, calculating sizes of reflected waves generated in the transmission line when the codes are transmitted based on the waveform data, and selecting one of the codes with a smallest reflected wave as a code to be transmitted to the other printed circuit board.

According to still another aspect of the present invention, a backplane data transmission method for a printed circuit board on a backplane that exchanges signals with another printed circuit board on the backplane via a transmission line, includes acquiring, from the other printed circuit board, waveform data on a waveform of a reflected wave generated in the transmission line upon transmission of a signal to the other printed circuit board, calculating a reflection cycle of the reflected wave based on the waveform data, and inserting a zero bit into the signal to be transmitted to the other printed circuit board based on a rule predetermined depending on the reflection cycle.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 7 is an example of waveform data that is stored in a storage unit shown in FIG. 5;

DETAILED DESCRIPTION OF THE PREFERRED EMBODIMENTS

Exemplary embodiments of the present invention are explained in detail below with reference to the accompanying drawings.

Figure 1:
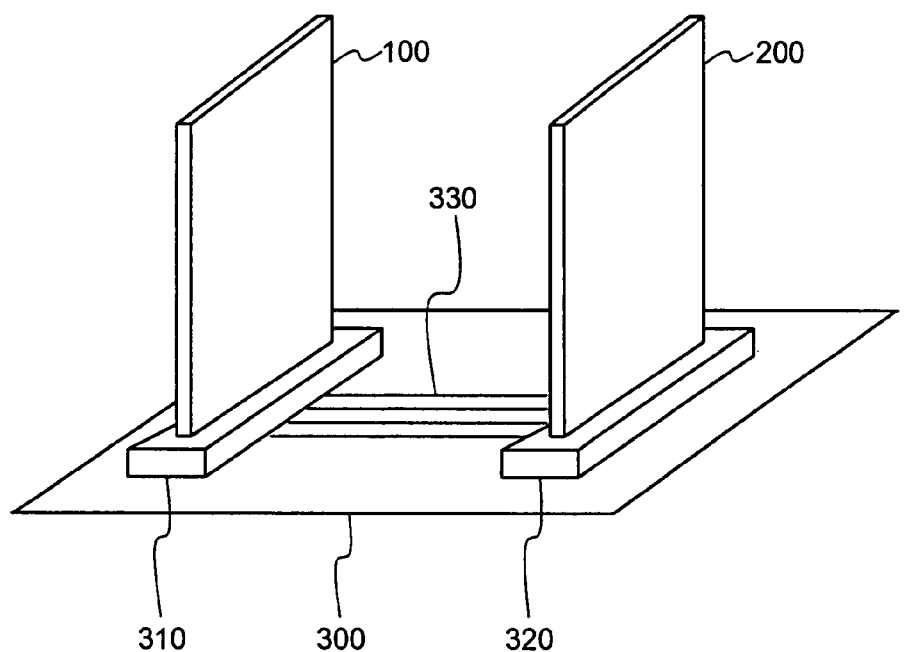
FIG. 1 is an example of an electronic device that includes printed circuit boards connected through a backplane.

FIG. 1 is an example of an electronic device that includes printed circuit boards (daughter board) connected through a backplane. The electronic device shown in FIG. 1 includes printed circuit boards 100 and 200 that are connected through a backplane 300. Each of the printed circuit boards 100 and 200 has predetermined functions. The backplane 300 is a printed circuit board, and includes connectors 310 and 320 and a wire 330 that electrically connects between the connectors 310 and 320.

The printed circuit board 100 is mounted on the connector 310 and the printed circuit board 200 is mounted on the connector 320. The printed circuit boards 100 and 200 are electrically connected through the backplane 300 and can exchange data with each other. This exchange of data via the backplane is referred to as backplane transmission.

Although only two printed circuit boards are shown in FIG. 1, three or more printed circuit boards can be connected to the backplane. Further, buses or switches can be used for wiring between the connectors on the backplane.

Figure 2:
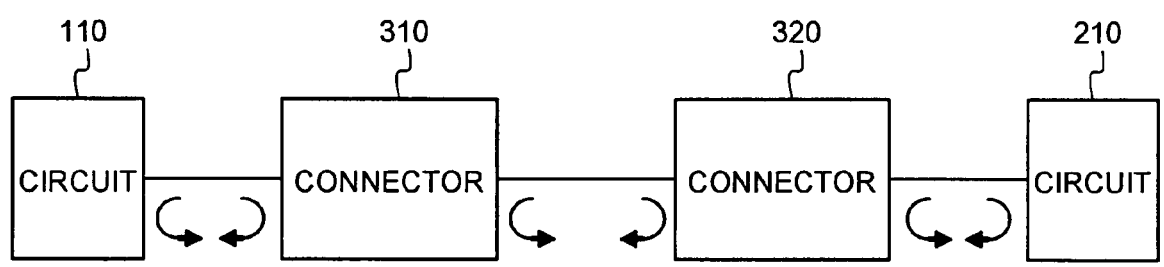
FIG. 2 is a schematic for explaining generation of reflected waves during backplane transmission.

When backplane transmission is performed in the structure shown in FIG. 1, reflected waves are generated, which may cause a data transmission error. FIG. 2 is a schematic for explaining generation of reflected waves during backplane transmission.

As shown in FIG. 2, when data is transmitted between a circuit 110 on the printed circuit board 100 and a circuit 210 on the printed circuit board 200, reflected waves due to impedance mismatch are generated in the vicinity of the circuits 110 and 210 and the connectors 310 and 320.

Among the reflected waves, the influence of a reflected wave generated between the circuit 110 and the connector 310 can be negligible by sufficiently reducing a distance between the circuit 110 and the connector 310. Similarly, the influence of a reflected wave generated between the circuit 210 and the connector 320 can be negligible by sufficiently reducing a distance between the circuit 210 and the connector 320.

However, for convenience of physical arrangement, a distance between the connectors 310 and 320 cannot be reduced to less than a predetermined value. Due to this, at the time of high-speed data transmission, a reflected wave generated between the connectors 310 and 320 adversely affects the data transmission.

Figure 3:
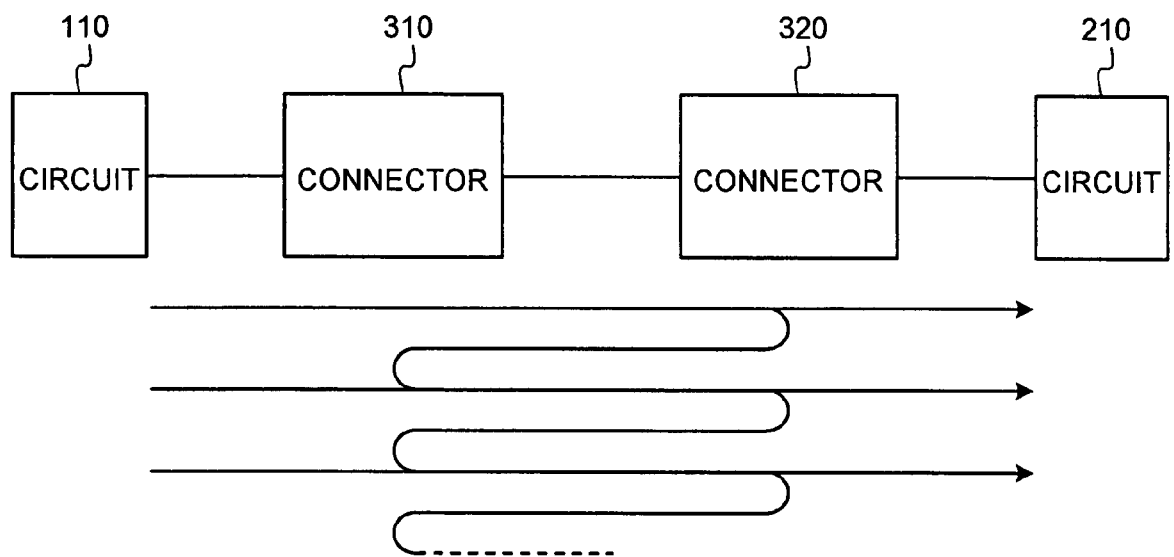
FIG. 3 is a schematic for explaining resonance of the reflected waves.
Figure 4:
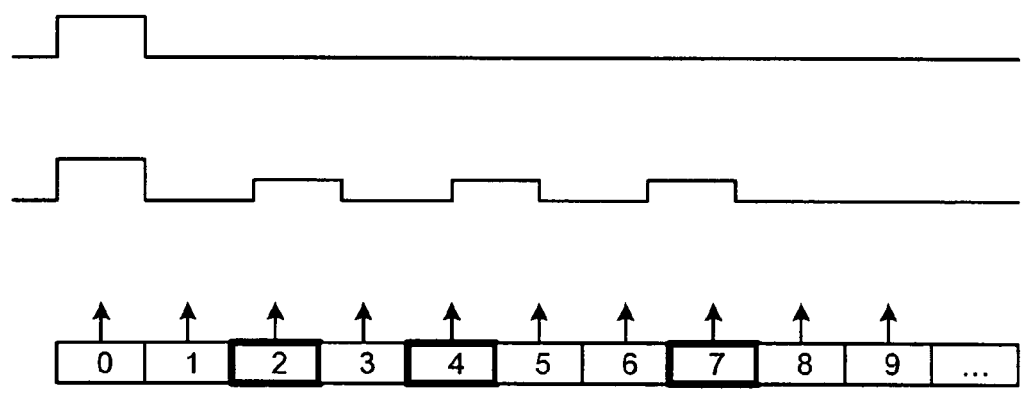
FIG. 4 is an example of a received waveform of a single pulse.

As shown in FIG. 3, the reflected wave generated in the vicinity of one of the connectors 310 and 320 is reflected again in the vicinity of the other connector and traverses between the connectors 310 and 320 until attenuated. Due to this, as shown in FIG. 4, even if a transmitter transmits a single pulse for transmitting one bit, a receiver detects multiple waveforms due to the reflected wave in addition to a waveform of a direct wave (hereinafter, "direct waveform"). In the example shown in FIG. 4, waveforms are detected in the second bit, the fourth bit, and the seventh bit where such waveforms are not supposed to exist.

Because the waveform of the reflected wave (hereinafter, "reflected waveform") is attenuated, the reflected waveform is smaller than the direct waveform in a single bit. However, the reflected waveform is superimposed with reflected waveforms that are generated during transmission of other bits and grows such that it may be mistakenly identified as a direct waveform.

To overcome the drawback, according to a first embodiment of the present invention, before starting backplane transmission, the transmitter transmits a single pulse to the receiver and the receiver analyzes the reflected waveforms. After starting backplane transmission, based on an analysis result of the reflected waveforms and already received bits, a size of the reflected wave is dynamically calculated at the receiver to correct an identification level.

Figure 5:
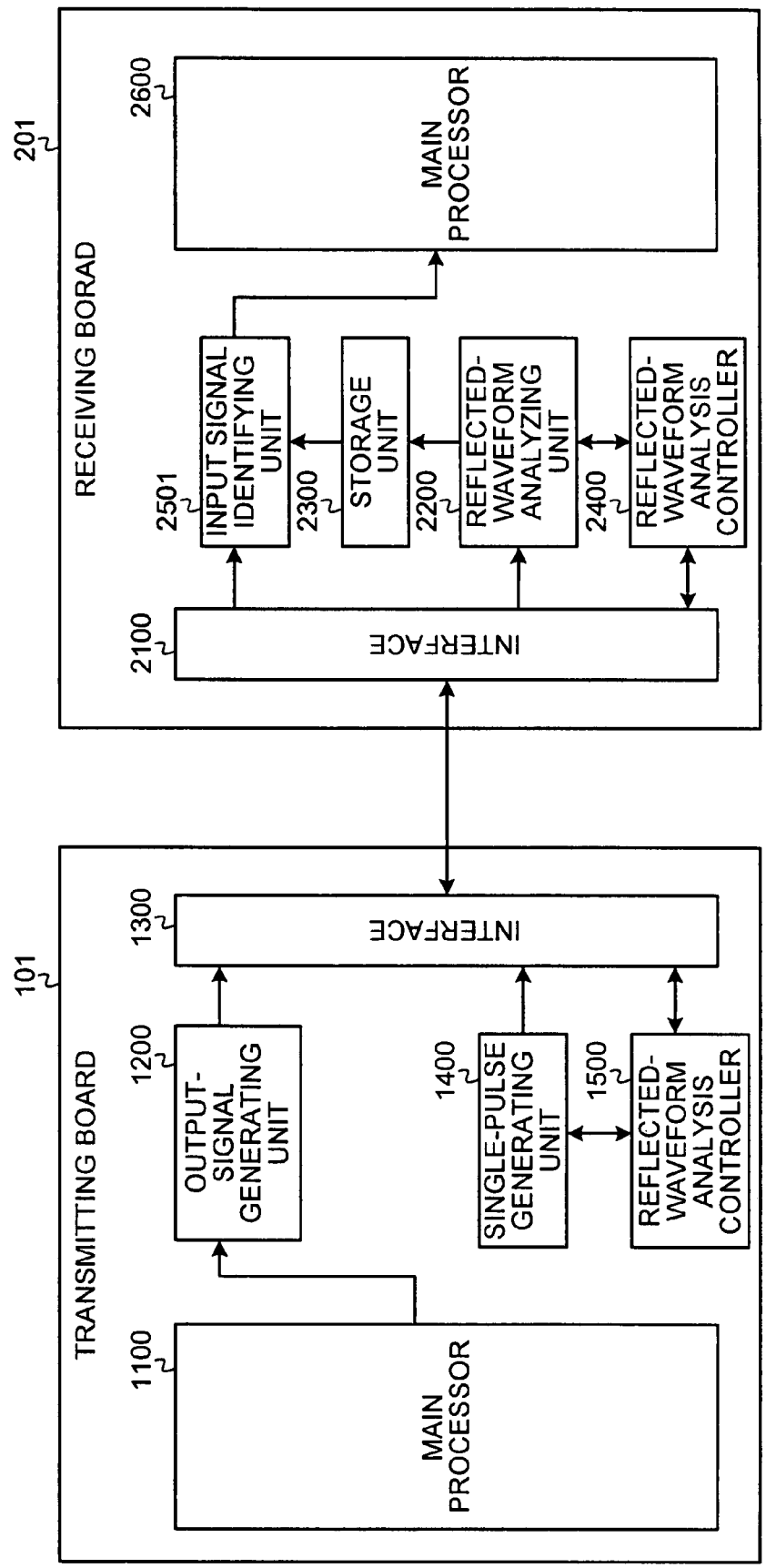
FIG. 5 is a functional block diagram of printed circuit boards according to a first embodiment of the present invention.

FIG. 5 is a functional block diagram of printed circuit boards 101 and 201 according to the first embodiment. In FIG. 5, for the sake of convenience, the printed circuit board 101 is explained as a transmitting board, while the printed circuit board 201 is explained as a receiving board. However, combining the structure of both the printed circuit boards 101 and 201 realizes a printed circuit board that can transmit and receive data (the same applies to other embodiments). Further, the backplane is not shown in FIG. 5.

The transmitting board 101 transmits data to the other printed circuit board by backplane transmission and includes a main processor 1100, an output-signal generating unit 1200, an interface 1300, a single-pulse generating unit 1400, and a reflected-waveform analysis-controller 1500.

The main processor 1100 realizes the essential functions of the transmitting board 101. The output-signal generating unit 1200 converts data that the main processor 1100 has requested to transmit into signals transmittable by backplane transmission. The interface 1300 connects the transmitting board 101 to the connectors of the backplane.

The single-pulse generating unit 1400 generates a single pulse that is used by the receiving board 201 to analyze the reflected waveforms. For realizing analysis of the reflected waveforms, the reflected-waveform analysis controller 1500 exercises various controls in synchronization with a reflected-waveform analysis controller 2400 of the receiving board 201. For example, the reflected-waveform analysis controller 1500 instructs the single-pulse generating unit 1400 to generate the single pulse at an appropriate timing.

The receiving board 201 receives data from the other printed circuit board by backplane transmission, and includes an interface 2100, a reflected-waveform analyzing unit 2200, a storage unit 2300, the reflected-waveform analysis controller 2400, an input signal identifying unit 2501, and a main processor 2600. The interface 2100 connects the receiving board 201 with the connectors of the backplane.

The reflected-waveform analyzing unit 2200 analyzes waveforms that are detected along with the single pulse generated by the single-pulse generating unit 1400. The storage unit 2300 stores therein waveform data obtained by the reflected-waveform analyzing unit 2200. For realizing the analysis of the reflected waveforms, the reflected-waveform analysis controller 2400 exercises various controls in synchronization with the reflected-waveform analysis controller 1500.

The input signal identifying unit 2501 identifies the waveforms of the signals that are transmitted by backplane transmission and reads the transmitted bits. To eliminate the influence of the reflected wave, the input signal identifying unit 2501 calculates the size of the currently received reflected wave based on the bits that are already read by the input signal identifying unit 2501 itself and the waveform data that is stored in the storage unit 2300 and changes a threshold value for determining whether the bits are on or off. Based on the data that is read by the input signal identifying unit 2501, the main processor 2600 realizes the essential functions of the receiving board 201.

Figure 6:
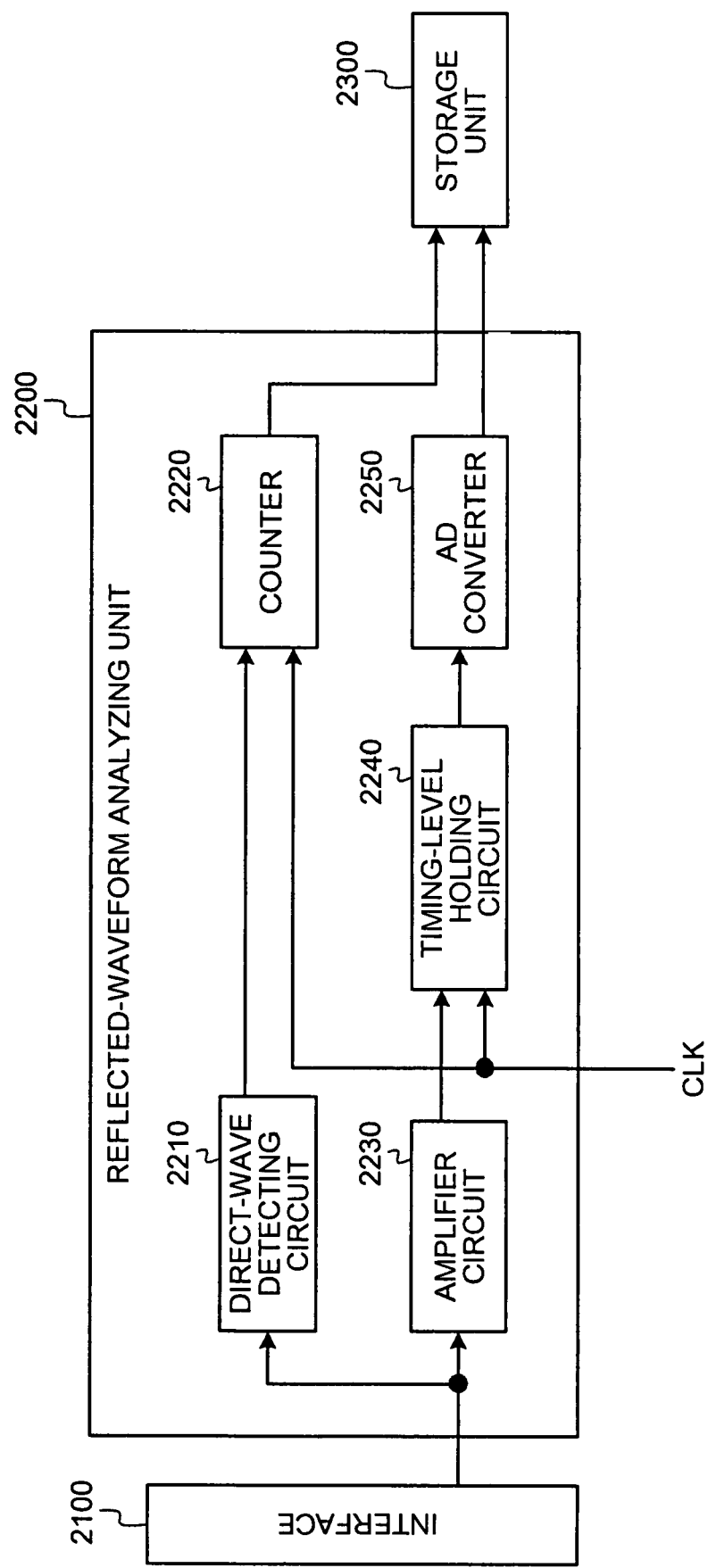
FIG. 6 is a functional block diagram of a reflected-waveform analyzing unit shown in FIG. 5.

FIG. 6 is a functional block diagram of the reflected-waveform analyzing unit 2200. The reflected-waveform analyzing unit 2200 includes a direct-wave detecting circuit 2210, a counter 2220, an amplifier circuit 2230, a timing-level holding circuit 2240, and an Analog to Digital (AD) converter 2250.

Upon receiving the direct wave of the single pulse, the direct-wave detecting circuit 2210 detects receipt of the direct wave and transmits a counter clear signal to the counter 2220. Upon receiving the counter clear signal, the counter 2220 resets a counter value to 0. Upon receiving clock signals that are supplied from an external device, the counter 2220 increments the counter value by 1.

The amplifier circuit 2230 is used for easy identification of the reflected waveforms. Upon receiving the clock signals from the external device, the timing-level holding circuit 2240 temporarily holds a voltage that is output from the amplifier circuit 2230 at that instant, and transmits the voltage to the AD converter 2250.

The AD converter 2250 uses AD conversion to quantify the voltage that is transmitted from the timing-level holding circuit 2240 and outputs a numerical value to the storage unit 2300. A correspondence is established between the numerical value that is output from the AD converter 2250 to the storage unit 2300 and the counter value that is maintained by the counter 2220 at that instant, and the numerical value is stored in the storage unit 2300.

After the single-pulse generating unit 1400 has generated the single pulse, the reflected-waveform analyzing unit 2200 receives the direct waveform and subsequently receives several reflected waveforms. Upon the reflected-waveform analyzing unit 2200 receiving the direct wave, the direct-wave detecting circuit 2210 transmits the counter clear signal and the counter value of the counter 2220 is cleared to 0.

Next, upon the external device supplying the clock signals, the counter value of the counter 2220 is incremented, a correspondence is established between the incremented counter value and a voltage value that indicates a height of the reflected waveforms received at that instant, and the counter value is stored in the storage unit 2300.

FIG. 7 is an example of the waveform data stored in the storage unit 2300. A delay time shown in FIG. 7 indicates the counter value of the counter 2220. A voltage level is the voltage value that indicates the height of the reflected waveforms. Thus, a change in the height of the waveforms of the reflected wave along with a passage of time is stored in the storage unit 2300.

To enable sufficiently detailed grasping of the change in the height of the reflected waveforms, the clock signals need to be supplied to the reflected-waveform analyzing unit 2200 in cycles that are as short as possible. Further, in the example of the waveform data shown in FIG. 7, the voltage level equivalent to the direct wave is set to 0. However, the voltage level equivalent to the direct wave can also be stored in the storage unit 2300 as a part of the waveform data.

Figure 8:
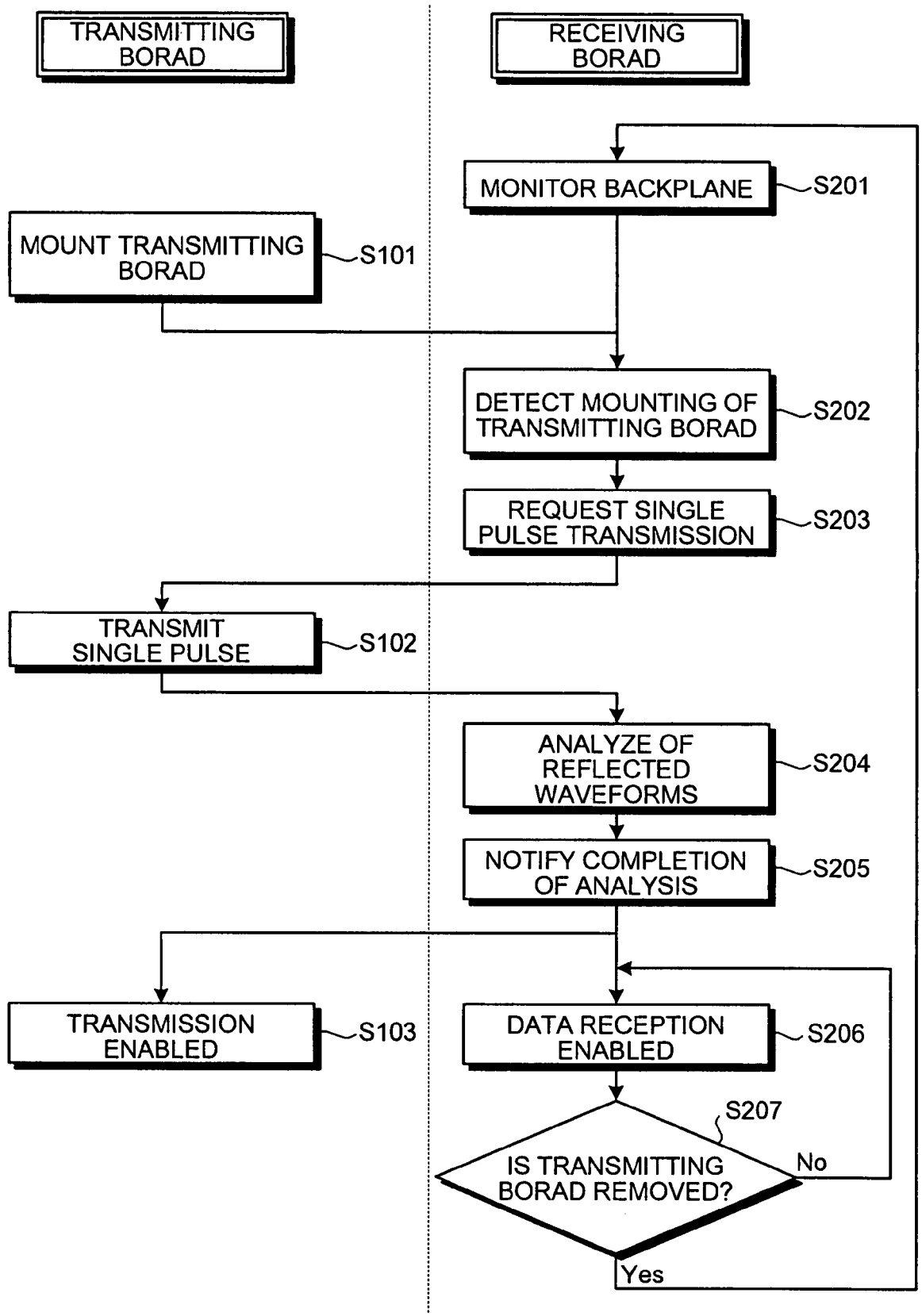
FIG. 8 is a flowchart of a reflected-waveform analysis control process.

FIG. 8 is a flowchart of a reflected-waveform analysis control process performed by the reflected-waveform analysis controller 2400. As shown in FIG. 8, in the receiving board 201, the reflected-waveform analysis controller 2400 monitors the backplane to determine whether a newly mounted printed circuit board exists (step S201).

When the transmitting board 101 is mounted on the backplane (step S101), the reflected-waveform analysis controller 2400 detects the mounting of the transmitting board 101 (step S202), requests the reflected-waveform analysis controller 1500 of the transmitting board 101 to transmit the single pulse and instructs the reflected-waveform analyzing unit 2200 to analyze the reflected waveforms (step S203).

Next, upon the single-pulse generating unit 1400 transmitting the single pulse according to an instruction from the reflected-waveform analysis controller 1500 (step S102) and the reflected-waveform analyzing unit 2200 completing the analysis of the reflected waveforms (step S204), the reflected-waveform analysis controller 2400 notifies the reflected-waveform analysis controller 1500 of the completion of the analysis (step S205).

Next, data transmission is enabled in the transmitting board 101 (step S103) and data reception is enabled in the receiving board 201 (step S206). The reflected-waveform analysis controller 2400 monitors the backplane, and upon removal of the transmitting board 101 from the backplane (Yes at step S207), restores the receiving board 201 to a state at step S201.

Only two printed circuit boards are mounted on the backplane in the reflected-waveform analysis control process shown in FIG. 8. In this case, the analysis of the reflected waveforms is performed at the time of mounting the printed circuit boards and does not pose any difficulty.

However, when three or more printed circuit boards are mounted on the backplane, characteristics of the reflected waves between already mounted printed circuit boards change due to mounting of a new printed circuit board. To overcome the drawback, when three or more printed circuit boards are mounted on the backplane, it is desirable to analyze the reflected waveforms for each data communication as explained below.

Figure 9:
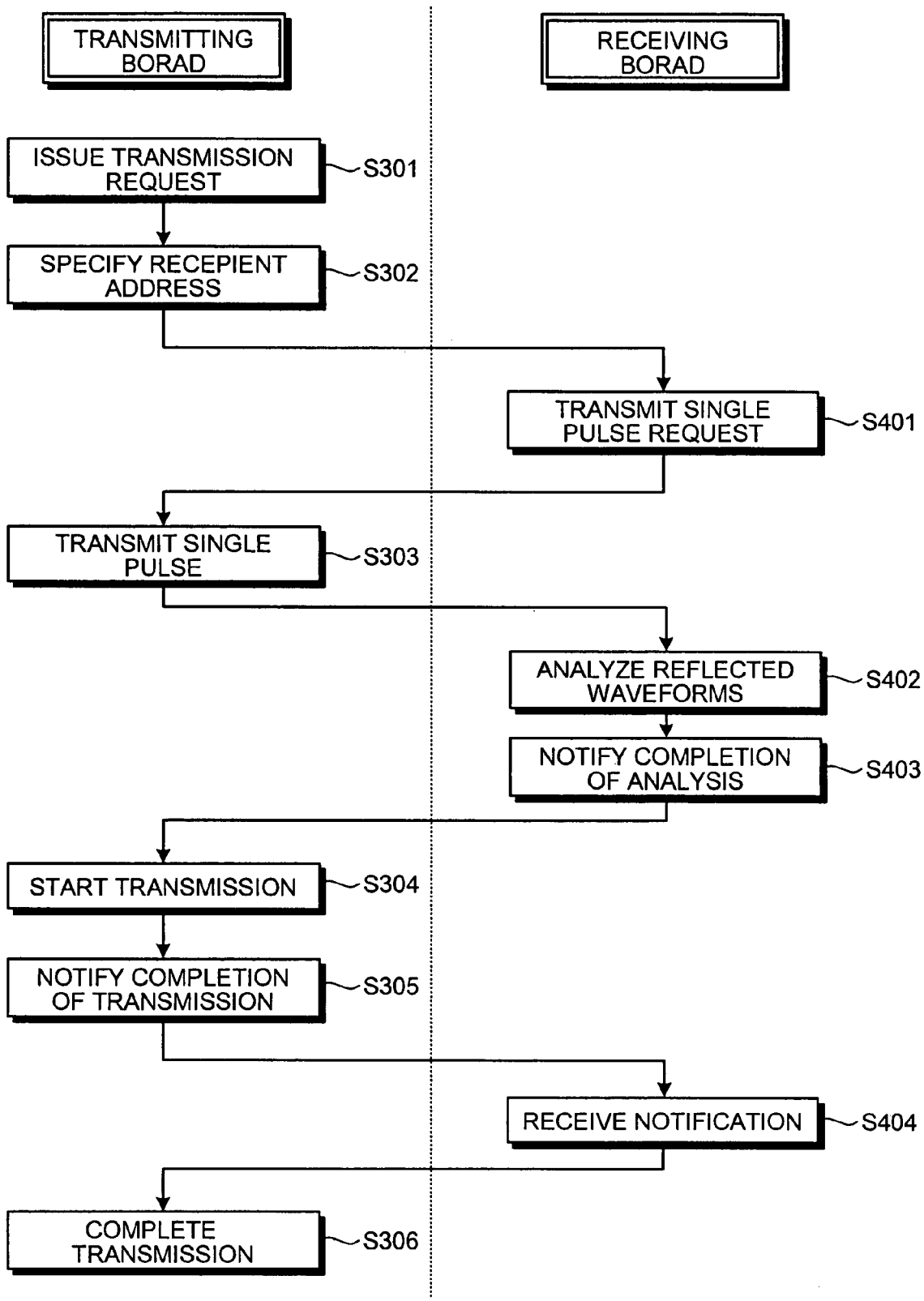
FIG. 9 is a flowchart of the reflected-waveform analysis control process when analysis is performed for each data communication.

FIG. 9 is a flowchart of the reflected-waveform analysis control process when the analysis is performed for each data communication. As shown in FIG. 9, when a data transmission request occurs in the transmitting board 101 (step S301), the transmitting board 101 specifies a recipient address to the receiving board 201 (step S302).

Upon specification of the recipient address to the receiving board 201, the reflected-waveform analysis controller 2400 requests the reflected-waveform analysis controller 1500 to transmit the single pulse and instructs the reflected-waveform analyzing unit 2200 to analyze the reflected waveforms (step S401).

Upon the single-pulse generating unit 1400 transmitting the single pulse (step S303) according to the instruction of the reflected-waveform analysis controller 1500 and the reflected-waveform analyzing unit 2200 completing the analysis of the reflected waveforms (step S402), the reflected-waveform analysis controller 2400 notifies the reflected-waveform analysis controller 1500 of the completion of the analysis (step S403).

Next, the transmitting board 101 starts data transmission (step S304) and, upon completion of data transmission, notifies the receiving board 201 that the data transmission has been completed (step S305). Upon receiving the notification, the receiving board 201 sends a response to the transmitting board 101 that the notification has been received (step S404).

Upon receiving the response, the transmitting board 101 ends a transmitting process (step S306).

Figure 10:
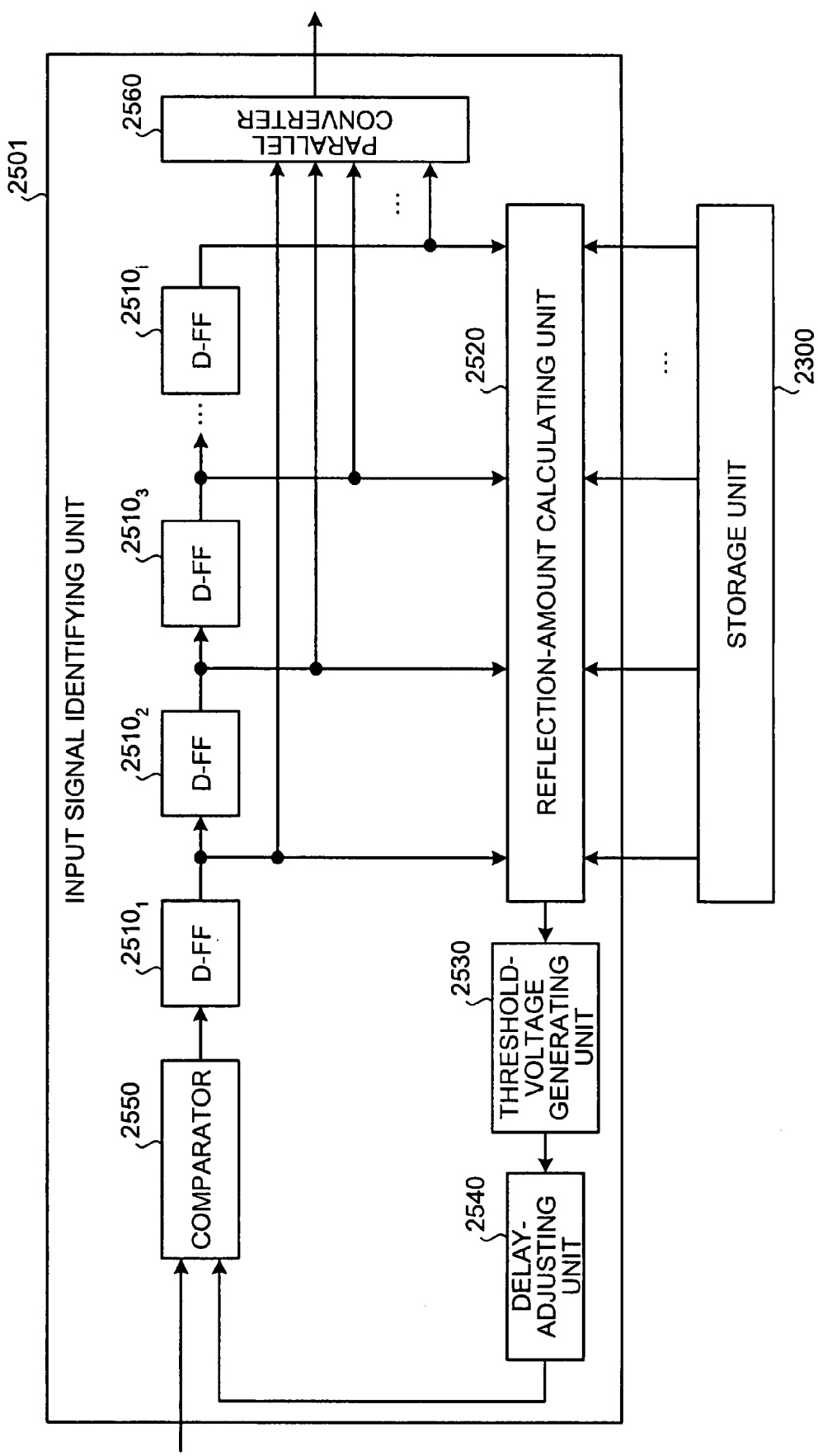
FIG. 10 is a functional block diagram of an input signal identifying unit shown in FIG. 5.

FIG. 10 is a functional block diagram of the input signal identifying unit 2501. The input signal identifying unit 2501 includes Delay Flip Flops (D-FF) $2510_1$ to $2510_i$, a reflection-amount calculating unit 2520, a threshold-voltage generating unit 2530, a delay-adjusting unit 2540, a comparator 2550, and a parallel converter 2560.

The D-FF $2510_1$ to $2510_i$ are circuits that maintain a result of whether the bits are on or off based on determination by the comparator 2550. The D-FF $2510_1$ maintains the latest determination result and the D-FF $2510_i$ maintains a result of determination before i number of times. A value of i needs to be sufficiently large for enhancing the precision of a calculation result of the reflection-amount calculating unit 2520.

Based on values of the D-FF $2510_1$ to $2510_i$ and the waveform data that is stored in the storage unit 2300, the reflection-amount calculating unit 2520 calculates the size of the reflected wave that is currently being received. For example, if only the values of the D-FF $2510_1$ and $2510_3$ are 1 (on), based on the waveform data stored in the storage unit 2300, the reflection-amount calculating unit 2520 calculates the size of the reflected wave upon a lapse of 1-bit time and upon a lapse of 3-bit time after transmission of the direct wave, and treats a sum of the calculated sizes as the size of the reflected wave in the signals that are currently being received.

The threshold-voltage generating unit 2530 generates a voltage that is used by the comparator 2550 as a standard to determine whether the bits are on or off. For eliminating the influence of the reflected wave, the threshold-voltage generating unit 2530 increases the generated voltage by a value equal to the value that is obtained as a result of the calculation by the reflection-amount calculating unit 2520. The delay-adjusting unit 2540 is a circuit that adjusts timing of transmission to the comparator 2550 of the voltage that is generated by the threshold-voltage generating unit 2530.

The comparator 2550 compares a voltage of the input signals with the voltage generated by the threshold-voltage generating unit 2530. If the voltage of the input signals is greater than the voltage generated by the threshold-voltage generating unit 2530, the comparator 2550 determines that the bit represented by the input signals is on. If the voltage of the input signals is not greater than the voltage generated by the threshold-voltage generating unit 2530, the comparator 2550 determines that the bit represented by the input signals is off.

The parallel converter 2560 calculates the values of the D-FF $2510_1$ to $2510_i$ for a predetermined bit count and outputs the calculated values as parallel data.

Figure 11:
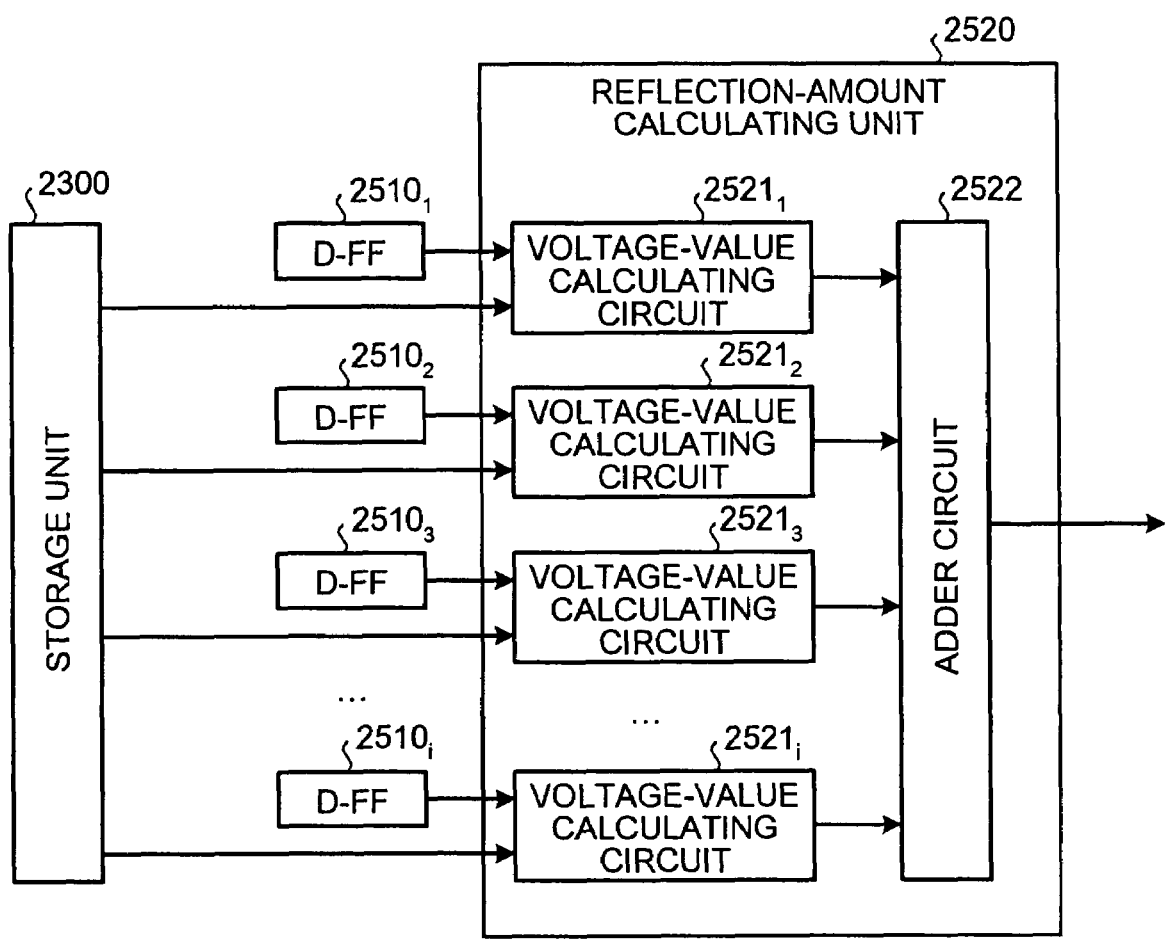
FIG. 11 is a functional block diagram of a reflection-amount calculating unit shown in FIG. 10.

FIG. 11 is a functional block diagram of the reflection-amount calculating unit 2520. The reflection-amount calculating unit 2520 includes voltage-value calculating circuits $2521_1$ to $2521_i$ and an adder circuit 2522.

The voltage-value calculating circuits $2521_1$ to $2521_i$ correspond one to one with the D-FF $2510_1$ to $2510_i$ respectively. If the value of the corresponding D-FF is 1, the voltage-value calculating circuits $2521_1$ to $2521_i$ refer to the waveform data that is stored in the storage unit 2300, acquire the current size of the reflected wave that originates from the bit corresponding to the D-FF, and convert the acquired current size into the voltage value. The adder circuit 2522 calculates a sum of the voltage values that are converted by the voltage-value calculating circuits $2521_1$ to $2521_i$.

Figure 12:
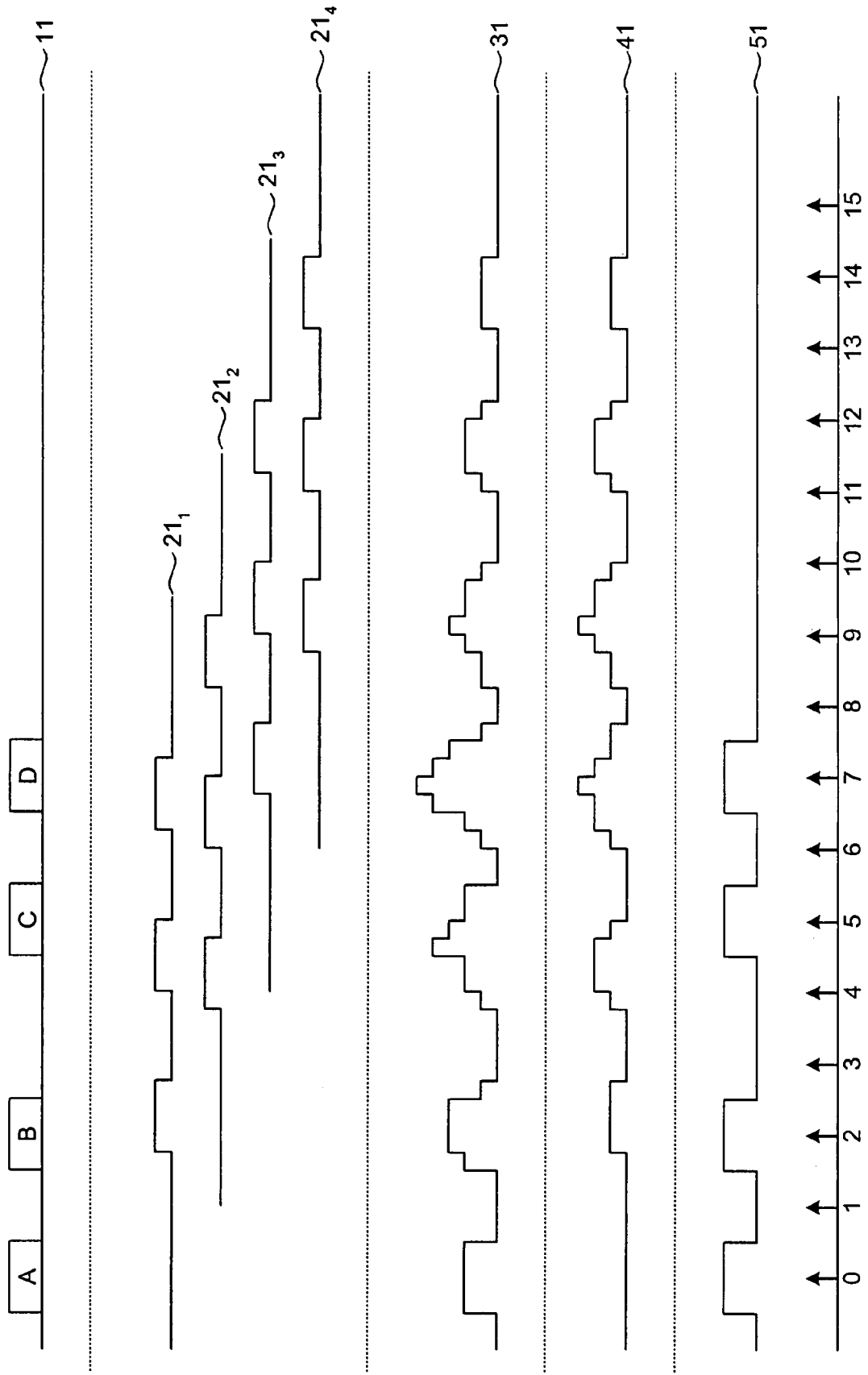
FIG. 12 is a schematic for explaining an example of backplane data transmission according to the first embodiment.

FIG. 12 is a schematic for explaining an example of backplane data transmission according to the first embodiment. The example shown in FIG. 12 indicates transmission of 8-bit data in a sequence of on, off, on, off, off, on, off, and on. In the example explained below, the on bits are sequentially called A bit, B bit, C bit, and D bit starting from the initial bit.

A waveform 11 indicates a waveform of the signals transmitted by the transmitting board 101. Waveforms $21_1$ to $21_4$ indicate waveforms of the reflected waves that are generated along with transmission of the A bit, the B bit, the C bit, and the D bit respectively. A waveform 31 is formed of the waveform 11 and the waveforms $21_1$ to $21_4$ superimposed each other. The receiving board 201 receives the waveform 31.

A waveform 41 indicates a shift in the amount of voltage that is supplied from the threshold-voltage generating unit 2530 to the comparator 2550 based on a calculation result of the reflection-amount calculating unit 2520. The waveform 41 matches the waveform 31 formed of the waveforms $21_1$ to $21_4$ superimposed each other. An identification result 51 indicates a result when the comparator 2550 uses a threshold value that is calculated by adding to the standard voltage value the voltage value indicated by the waveform 41 and reads to determine whether the bits from the waveform are on or off.

In the backplane transmission according to the first embodiment, based on the analysis result of the reflected waveforms and a state of the already read bits, the size of the reflected wave is accurately calculated, and the size of the reflected wave is added to the threshold value for determining whether the bits are on or off. Thus, as indicated by the waveform 31, even if the waveform received by the receiving board 201 is greatly distorted due to influence of the reflected wave, the identification result 51 indicates that data can be received accurately.

A modification of the receiving board 201 indicated in the first embodiment is explained next. A receiving board 202 explained in a second embodiment of the present invention has a structure that is even more appropriate for high-speed backplane transmission compared to the receiving board 201.

Figure 13:
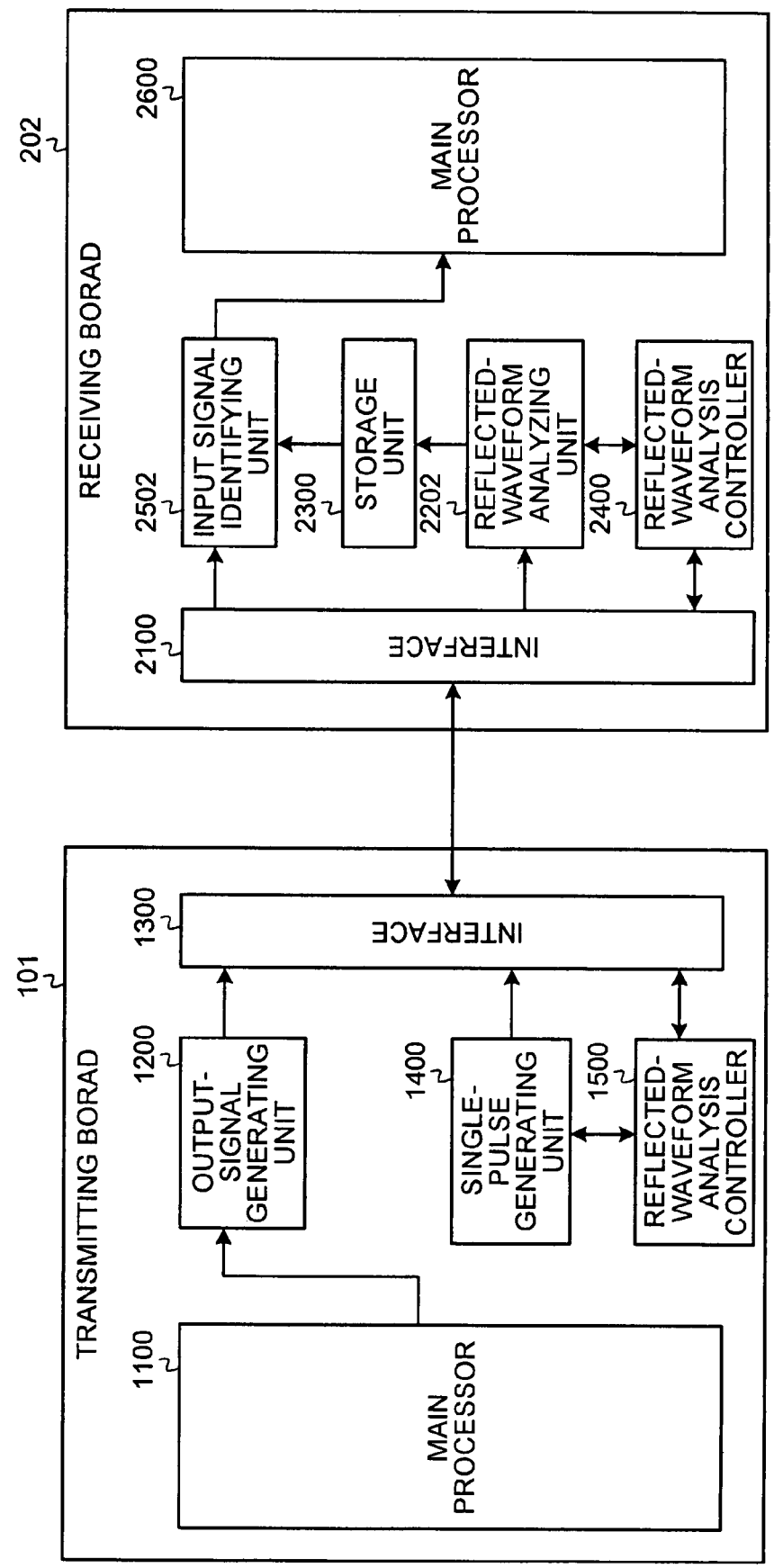
FIG. 13 is a functional block diagram of printed circuit boards according to a second embodiment of the present invention.

FIG. 13 is a functional block diagram of the printed circuit boards 101 and 202 according to the second embodiment. The backplane is not shown in FIG. 13.

The transmitting board 101 is similar to the transmitting board 101 shown in FIG. 5. The receiving board 202 receives data from the other printed circuit board by backplane transmission. The receiving board 202 includes the interface 2100, a reflected-waveform analyzing unit 2202, the storage unit 2300, the reflected-waveform analysis controller 2400, an input signal identifying unit 2502, and the main processor 2600.

Because the interface 2100, the storage unit 2300, the reflected-waveform analysis controller 2400, and the main processor 2600 are similar to those in FIG. 5, the same explanation is not repeated.

The reflected-waveform analyzing unit 2202 analyzes the waveforms that are detected along with the single pulse that is generated by the single-pulse generating unit 1400 and acquires the waveform data of he reflected wave. The input signal identifying unit 2502 identifies the waveforms of the signals that are transmitted by backplane transmission and reads the transmitted bits.

Figure 14:
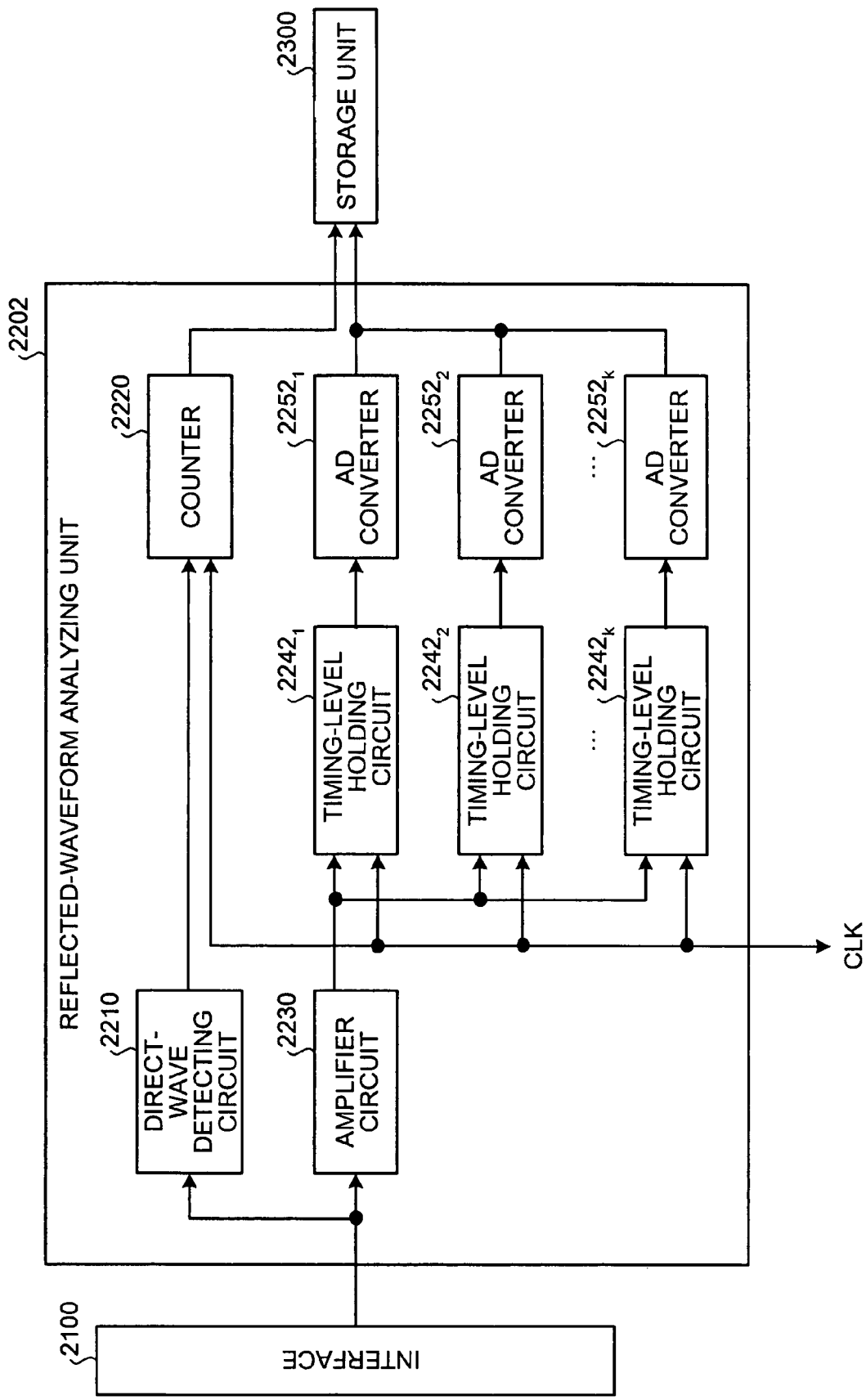
FIG. 14 is a functional block diagram of a reflected-waveform analyzing unit shown in FIG. 13.

FIG. 14 is a functional block diagram of the reflected-waveform analyzing unit 2202. The reflected-waveform analyzing unit 2202 includes the direct-wave detecting circuit 2210, the counter 2220, the amplifier circuit 2230, timing-level holding circuits $2242_1$ to $2242_k$, and AD converters $2252_1$ to $2252_k$.

The reflected-waveform analyzing unit 2200 includes only one pair of the timing-level holding circuit and the AD converter. However, the reflected-waveform analyzing unit 2202 includes k pairs of the timing-level holding circuits and the AD converters.

An increase in the transmission speed of backplane transmission necessitates a precise analysis of the reflected waveforms. However, because the timing-level holding circuit is a type of storage circuit, enhancing an operation speed of the timing-level holding circuit is difficult, thus making it difficult to enhance the analysis precision of the reflected waveforms. To overcome the drawback, the reflected-waveform analyzing unit 2202 includes multiple timing-level holding circuits. Enhancement of the analysis precision of the reflected waveforms is realized by operating the timing-level holding circuits by marginally delaying a timing of each timing-level holding circuit.

Figure 15:
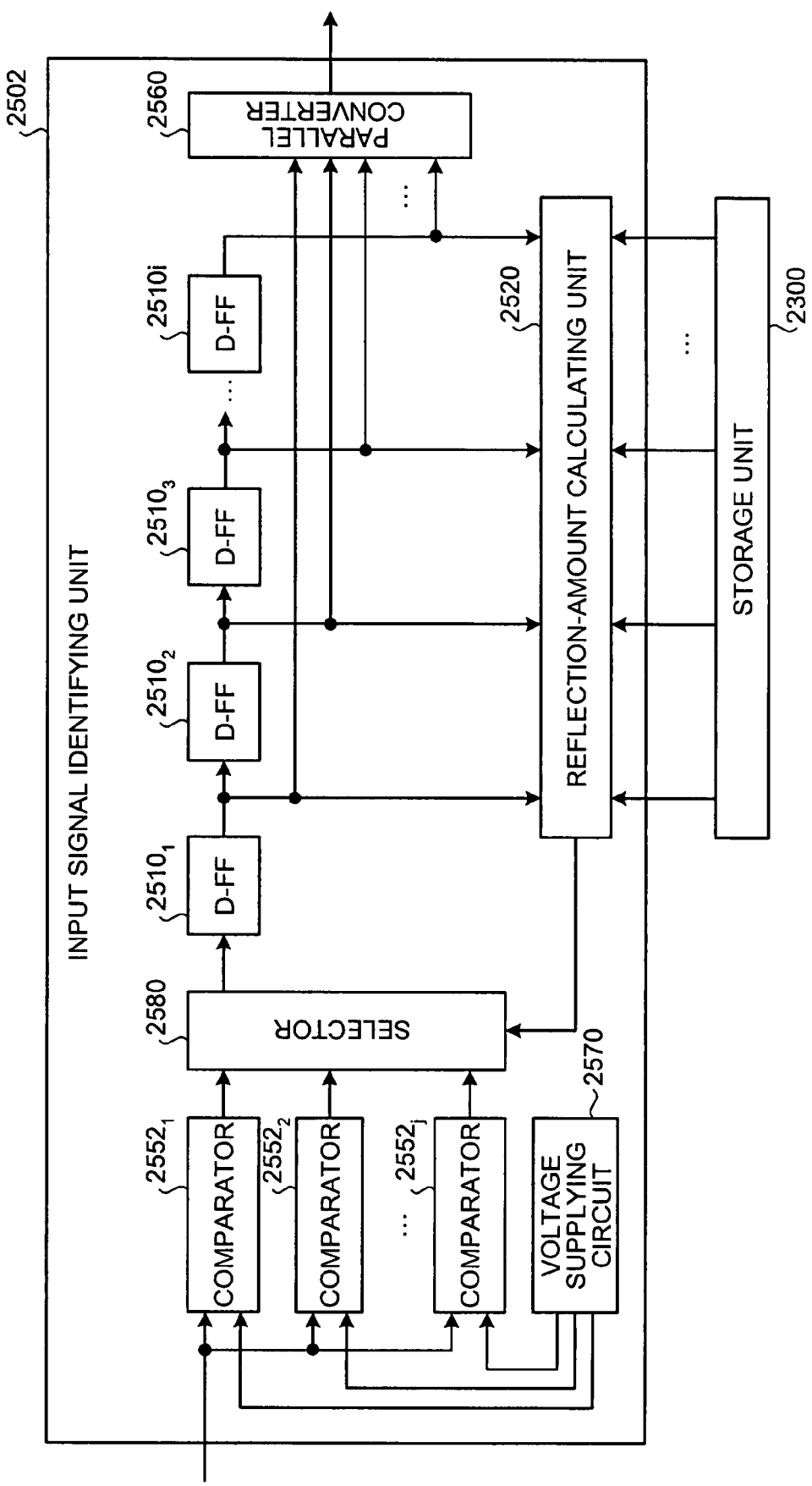
FIG. 15 is a functional block diagram of an input signal identifying unit shown in FIG. 13.

FIG. 15 is a functional block diagram of the input signal identifying unit 2502. The input signal identifying unit 2502 includes the D-FF $2510_1$ to $2510_i$, the reflection-amount calculating unit 2520, comparators $2552_1$ to $2552_j$, the parallel converter 2560, a voltage supplying circuit 2570, and a selector 2580.

Because the D-FF $2510_1$ to $2510_i$, the reflection-amount calculating unit 2520, and the parallel converter 2560 are similar to those shown in FIG. 10, the same explanation is not repeated.

The voltage supplying circuit 2570 supplies marginally different voltages to the comparators $2552_1$ to $2552_j$. The minimum voltage supplied by the voltage supplying circuit 2570 is equivalent to the direct wave that is not affected by the reflected wave. The maximum voltage supplied by the voltage supplying circuit 2570 is equivalent to a wave when the direct wave is superimposed with the waveforms of the largest reflected wave.

The comparators $2552_1$ to $2552_j$ compare the voltage of the input signals with the voltage that is supplied from the voltage supplying circuit 2570. If the voltage of an input signal is greater than the voltage supplied from the voltage supplying circuit 2570, the comparators $2552_1$ to $2552_j$ determine that the input signal is high. If the voltage of an input signals is less than the voltage supplied from the voltage supplying circuit 2570, the comparators $2552_1$ to $2552_j$ determine that the input signal is low.

Among the comparators $2552_1$ to $2552_j$, the selector 2580 converts into on/off of bits, the output of the comparators that are supplied with a voltage corresponding to the calculation result of the reflection-amount calculating unit 2520, and outputs the converted output to the D-FF $2510_1$. For example, if the calculation result of the reflection-amount calculating unit 2520 indicates that the influence of the reflected wave is entirely absent, the selector 2580 converts into on/off of bits the output of the comparator that is supplied with the minimum voltage and outputs the converted output to the D-FF $2510_1$.

In the structure of the input signal identifying unit 2501 shown in FIG. 10, the threshold-voltage generating unit 2530, which dynamically changes the voltage that is supplied to the comparator 2550, is an analog circuit, thus making it difficult to realize a high-speed operation. However, the input signal identifying unit 2502 does not carry out a process to dynamically change the voltage and all the components related to the operation speed are digital circuits. Thus, a high-speed operation can be easily realized.

Figure 16:
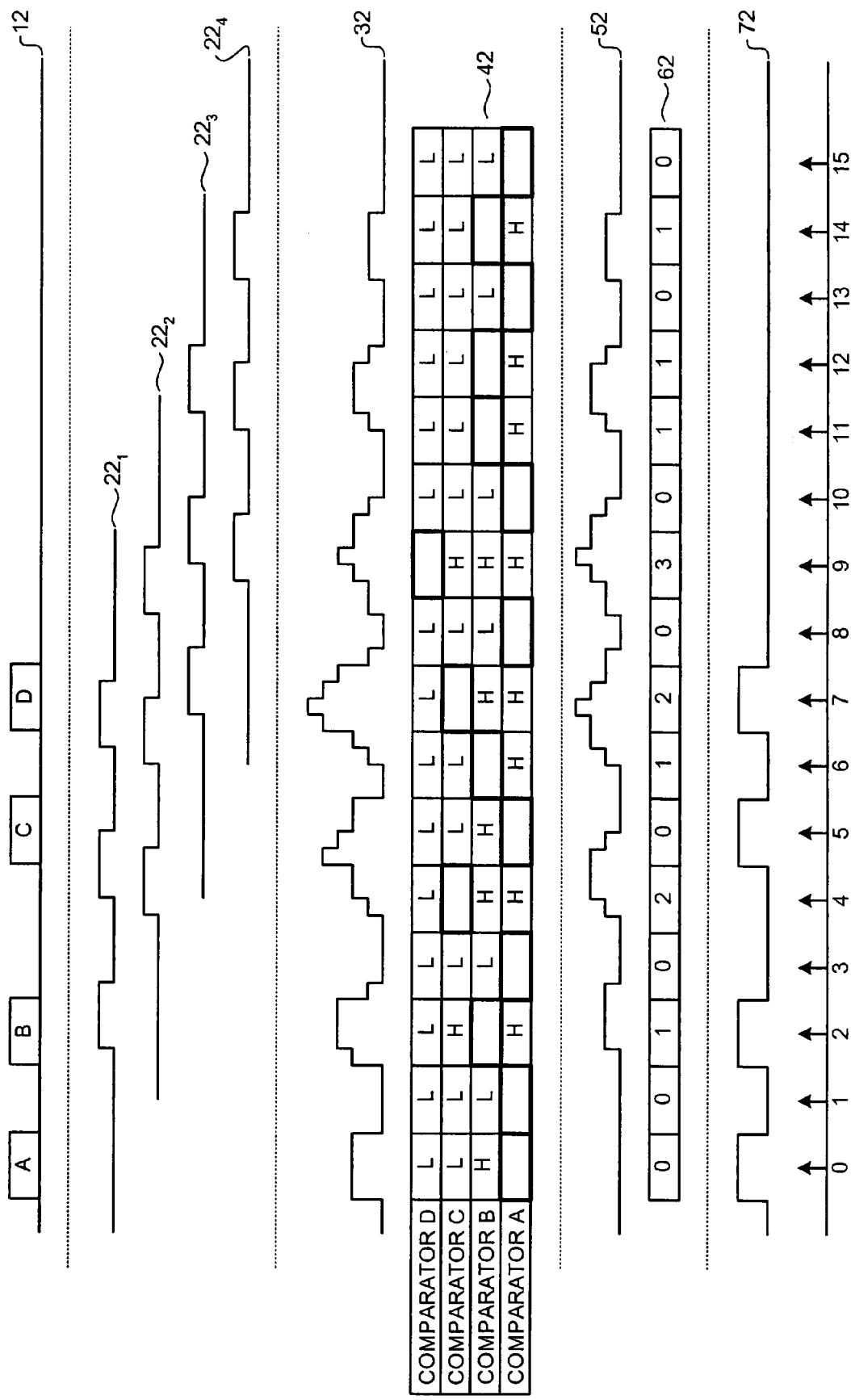
FIG. 16 is a schematic for explaining an example of backplane data transmission according to the second embodiment.

FIG. 16 is a schematic for explaining an example of backplane data transmission according to the second embodiment. The example shown in FIG. 16 indicates transmission of 8-bit data in a sequence of on, off, on, off, off, on, off, and on. In the example explained below, the on bits are sequentially called A bit, B bit, C bit, and D bit starting from the initial bit.

A waveform 12 indicates a waveform of the signals transmitted by the transmitting board 101. Waveforms $22_1$ to $22_4$ indicate waveforms of the reflected waves that are generated along with transmission of the A bit, the B bit, the C bit, and the D bit respectively. A waveform 32 is formed of the waveform 12 and the waveforms $22_1$ to $22_4$ superimposed each other. The receiving board 202 receives the waveform 32.

Comparators A to D compare a voltage indicating the waveform 32 with the voltages that are supplied to the comparators A to D themselves. Determination result data 42 indicates a result of the comparison. It is assumed that the voltage supplied to the comparators A to D increases sequentially in the order of the comparator D, the comparator C, the comparator B, and the comparator A.

A waveform 52 is formed of the waveforms $22_1$ to 224 superimposed each other. Calculation result data 62 is a calculation result of the reflection-amount calculating unit 2520. A change in the magnitude of the calculation result of the reflection-amount calculating unit 2520 corresponds to a change in the waveform 52.

An identification result 72 indicates a result when the selector 2580 selects the determination result of the comparators corresponding to the calculation result of the reflection-amount calculating unit 2520 and converts the selected determination result to on/off of bits. In the example shown in FIG. 16, "0" in the calculation result of the reflection-amount calculating unit 2520 corresponds to the comparator A, "1" corresponds to the comparator B, "2" corresponds to the comparator C, and "3" corresponds to the comparator D.

Thus, in the backplane transmission according to the second embodiment, modifying a structure of the components that hamper enhancement of the transmission speed of backplane transmission enables a high-speed backplane transmission while eliminating the influence of the reflected wave.

Repeated traversing of the reflected wave between the connectors 310 and 320 is explained with reference to FIG. 3. If the direct wave is repeatedly transmitted due to overlapping with traversing cycles of the reflected wave, the reflected wave is likely to grow significantly due to resonance.

To prevent occurrence of such a phenomenon, the transmitting printed circuit board needs to be controlled to prior estimate the influence of the reflected wave and to prevent growth of the reflected wave. In a third embodiment of the present invention, the transmitting printed circuit board performs a process to curb growth of the reflected wave.

Figure 17:
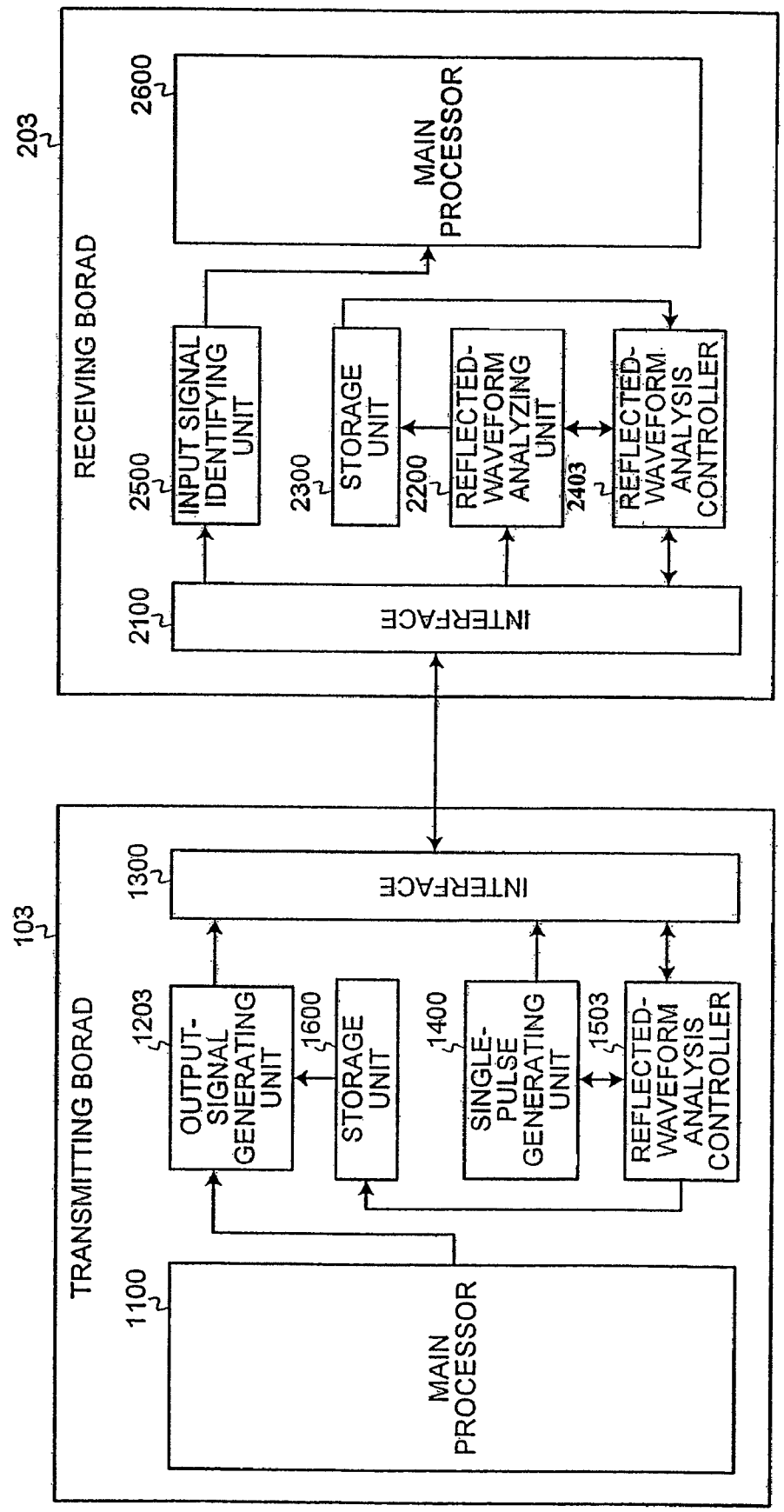
FIG. 17 is a functional block diagram of printed circuit boards according to a third embodiment of the present invention.

FIG. 17 is a functional block diagram of printed circuit boards 103 and 203 according to the third embodiment. The backplane is not shown in FIG. 17.

The transmitting board 103 transmits data to the other printed circuit board. The transmitting board 103 includes the main processor 1100, an output-signal generating unit 1203, the interface 1300, the single-pulse generating unit 1400, a reflected-waveform analysis controller 1503, and a storage unit 1600.

Because the main processor 1100, the interface 1300, and the single-pulse generating unit 1400 are similar to those shown in FIG. 5, the same explanation is not repeated.

The output-signal generating unit 1203 converts data that the main processor 1100 has requested to transmit into signals transmittable by backplane transmission. Based on the already transmitted bits and the waveform data of the reflected waves that is stored in the storage unit 1600, the output-signal generating unit 1203 calculates the size of the reflected wave superimposed on the signals for transmission and reduces an output level by a margin equivalent to the size of the reflected wave.

Due to this, growth of the reflected wave is curbed. Further, based on a fixed identification level, the receiving board 203 can determine whether the bits are on or off. A waveform, which includes the direct wave, is adjusted to a predetermined height by the output-signal generating unit 1203, and the waveforms that do not include the direct wave attenuate and decrease.

For realizing the analysis of the reflected waveforms, the reflected-waveform analysis controller 1503 exercises various types of control in synchronization with a reflected-waveform analysis controller 2403 of the receiving board 203. For example, the reflected-waveform analysis controller 1503 instructs the single-pulse generating unit 1400 to generate the single pulse at an appropriate timing. Further, after the analysis of the reflected wave in the receiving board 203 is completed, the reflected-waveform analysis controller 1503 requests the reflected-waveform analysis controller 2403 to transfer the waveform data of the reflected wave, and stores the transferred waveform data in the storage unit 1600.

The receiving board 203 receives data from the other printed circuit board by backplane transmission. The receiving board 203 includes the interface 2100, the reflected-waveform analyzing unit 2200, the storage unit 2300, the reflected-waveform analysis controller 2403, an input signal identifying unit 2500, and the main processor 2600.

Because the interface 2100, the reflected-waveform analyzing unit 2200, the storage unit 2300, and the main processor 2600 are similar to those shown in FIG. 5, the same explanation is not repeated.

For realizing the analysis of the reflected waveforms, the reflected-waveform analysis controller 2403 exercises various types of control in synchronization with the reflected-waveform analysis controller 1503. In addition to the functions of the reflected-waveform analysis controller 2400 shown in FIG. 5, the reflected-waveform analysis controller 2403 also has a function to transfer to the transmitting board 103 the waveform data of the reflected wave that is stored by the storage unit 2300.

The input signal identifying unit 2500 identifies the waveforms of the signals that are transmitted by backplane transmission and reads the transmitted bits. The input signal identifying unit 2500 determines whether the bits are on or off using the fixed identification level as a standard without considering the influence of the reflected wave.

Figure 18:
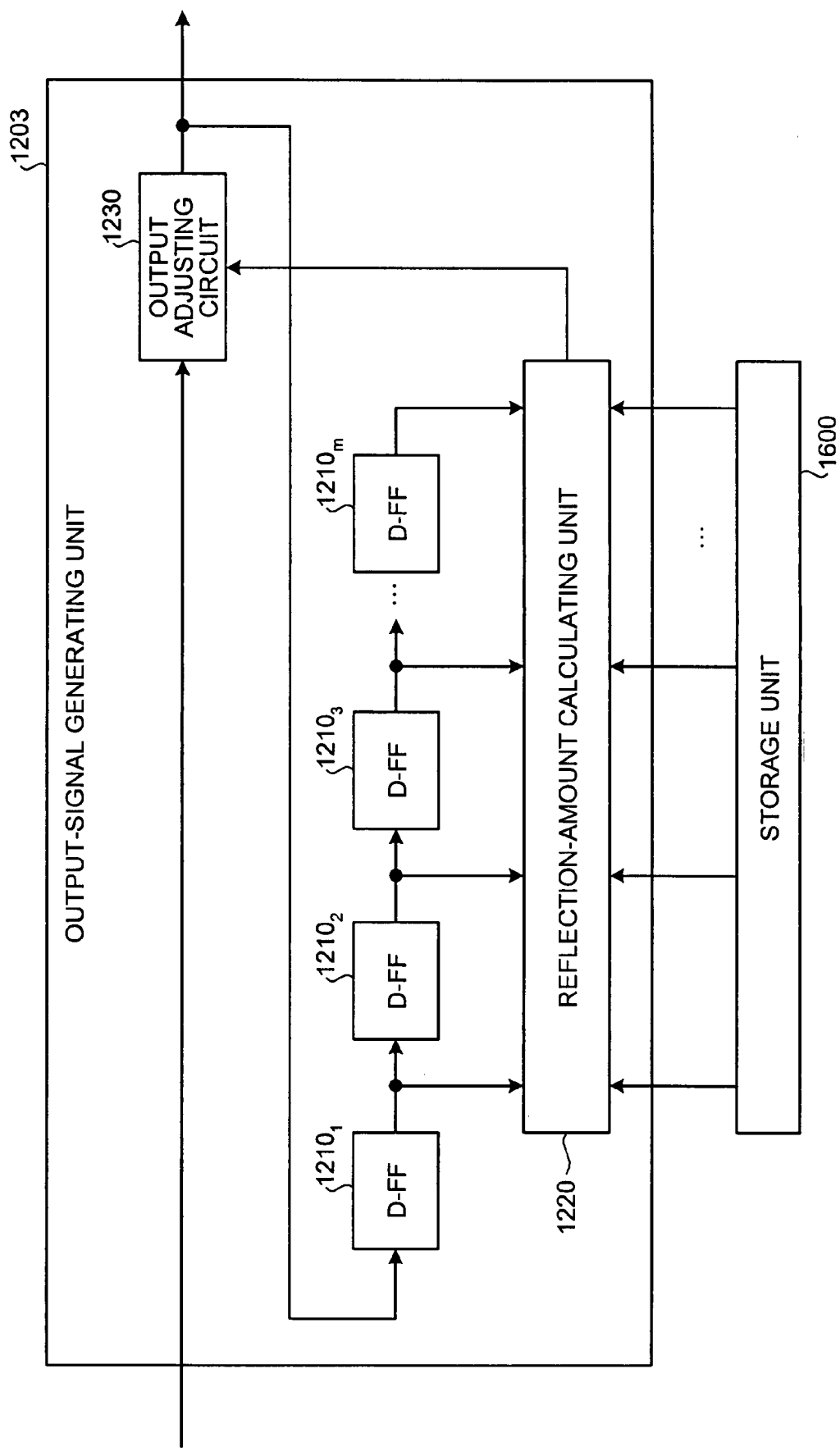
FIG. 18 is a functional block diagram of an output-signal generating unit shown in FIG. 17.

FIG. 18 is a functional block diagram of the output-signal generating unit 1203. The output-signal generating unit 1203 includes D-FF $1210_1$ to $1210_m$, a reflection-amount calculating unit 1220, and an output adjusting circuit 1230. The D-FF $1210_1$ to $1210_m$ are circuits that maintain the magnitude of signals output from the output adjusting circuit 1230.

Based on the values of the D-FF $1210_1$ to $1210_m$ and the waveform data that is stored in the storage unit 1600, the reflection-amount calculating unit 1220 calculates the size of the reflected wave superimposed on the signals for output. The reflection-amount calculating unit 1220 is realized by a structure that is similar to the structure of the reflection-amount calculating unit 2520.

The output adjusting circuit 1230 reduces the output level of the signals by a margin equivalent to the size of the reflected wave calculated by the reflection-amount calculating unit 1220.

In the backplane transmission according to the third embodiment, the magnitude of a signal to be output needs to be finely adjusted for preventing a transmission error. The output-signal generating unit 1203 needs to be structured in a way such that the output level of the signals is adjusted using further minute units instead of bit units.

Figure 19:
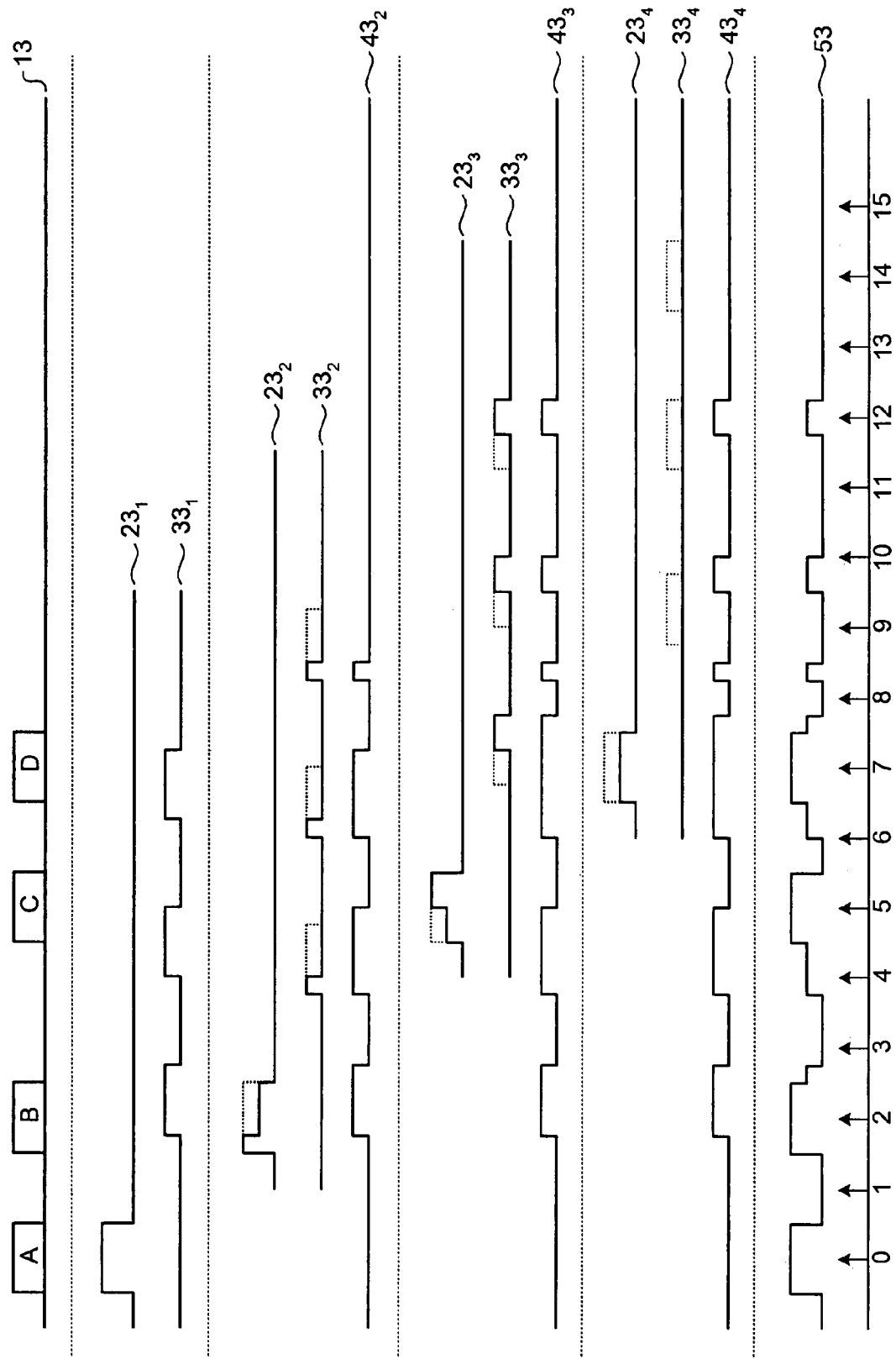
FIG. 19 is a schematic for explaining an example of backplane data transmission according to the third embodiment.

FIG. 19 is a schematic for explaining an example of backplane data transmission according to the third embodiment. The example shown in FIG. 19 indicates transmission of 8-bit data in a sequence of on, off, on, off, off, on, off, and on. In the example explained below, the on bits are sequentially called A bit, B bit, C bit, and D bit starting from the initial bit.

A waveform 13 indicates a waveform that is to be transmitted from the transmitting board 103 to the receiving board 203. A waveform $23_1$ indicates a waveform of the signal that is transmitted by the transmitting board 103 for transmitting the A bit. A waveform $33_1$ indicates a waveform of the reflected wave that is generated along with transmission of the waveform $23_1$.

A waveform $23_2$ indicates a waveform of the signal that is transmitted by the transmitting board 103 for transmitting the B bit. To prevent growth of a portion that is superimposed on the waveform $33_1$, a portion of the waveform $23_2$ is missing. A waveform $33_2$ indicates a waveform of the reflected wave that is generated along with transmission of the waveform $23_2$. Because a portion of the waveform $23_2$ is missing, a portion of the waveform $33_2$ is also missing. A waveform $43_2$ indicates a waveform of the reflected wave formed of a composite of the waveforms $33_1$ and $33_2$.

A waveform $23_3$ indicates a waveform of the signal that is transmitted by the transmitting board 103 for transmitting the C bit. To prevent growth of a portion that is superimposed on the waveform $43_2$, a portion of the waveform $23_3$ is missing. A waveform $33_3$ indicates a waveform of the reflected wave that is generated along with transmission of the waveform $23_3$. Because a portion of the waveform $23_3$ is missing, a portion of the waveform $33_3$ is also missing. A waveform $43_3$ indicates a waveform of the reflected wave formed of a composite of the waveforms $43_2$ and $33_2$.

A waveform $23_3$ indicates a waveform of the signal that is transmitted by the transmitting board 103 for transmitting the C bit. To prevent growth of a portion that is superimposed on the waveform $43_2$, a portion of the waveform $23_3$ is missing. A waveform $33_3$ indicates a waveform of the reflected wave that is generated along with transmission of the waveform $23_3$. Because a portion of the waveform $23_3$ is missing, a portion of the waveform $33_3$ is also missing. A waveform $43_3$ indicates a waveform of the reflected wave formed of a composite of the waveforms $43_2$ and $33_3$.

A waveform 53 is formed of a composite of the waveforms $23_1$, $23_2$, $23_3$, $23_4$, and $43_4$, and indicates a waveform actually received by the receiving board 203. Although a shape of the entire waveform 53 differs from a shape of the waveform 13, the waveform 53 matches the waveform 13 in shape at a high level. This indicates that the data is transmitted accurately.

In the backplane transmission according to the third embodiment, growth of the reflected wave can be curbed and data can be accurately transmitted from the transmitting board to the receiving board by reducing the influence of the reflected wave.

An example of curbing growth of the reflected wave using block codes is explained next. The block codes indicates block codes such as 8B/10B codes in which two codes, a plus code and a minus code, are defined for a bit sequence.

Figure 20:
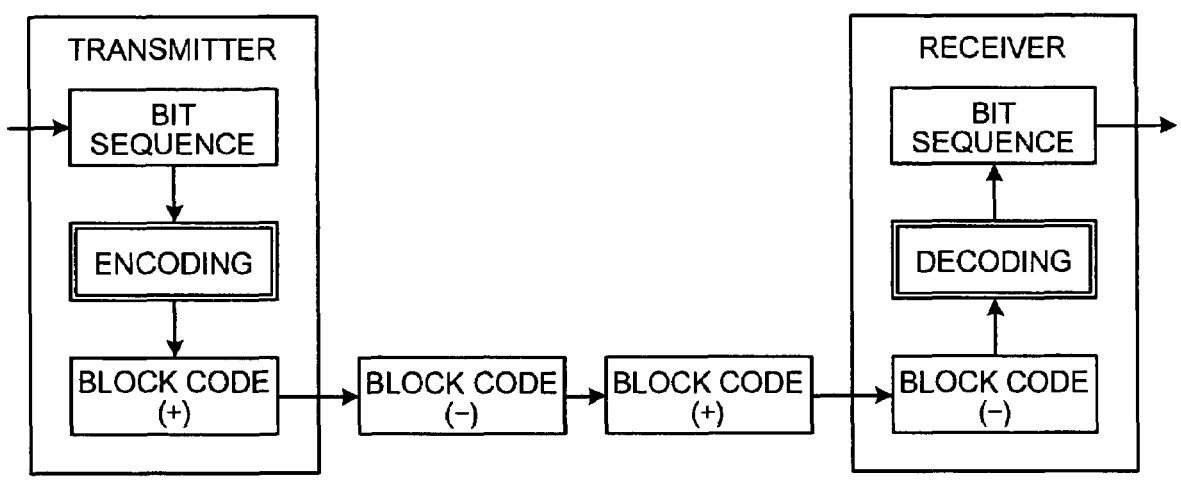
FIG. 20 is a schematic for explaining an example of common data transmission using block codes.

FIG. 20 is a schematic for explaining an example of common data transmission using the block codes. As shown in FIG. 20, in the common data transmission using the block codes, to prevent a continuous transmission of "0" or "1" for more than a fixed number of times, a bit sequence of a specified width is block encoded using alternate plus encoding and minus encoding to carry out data transmission.

Figure 21:
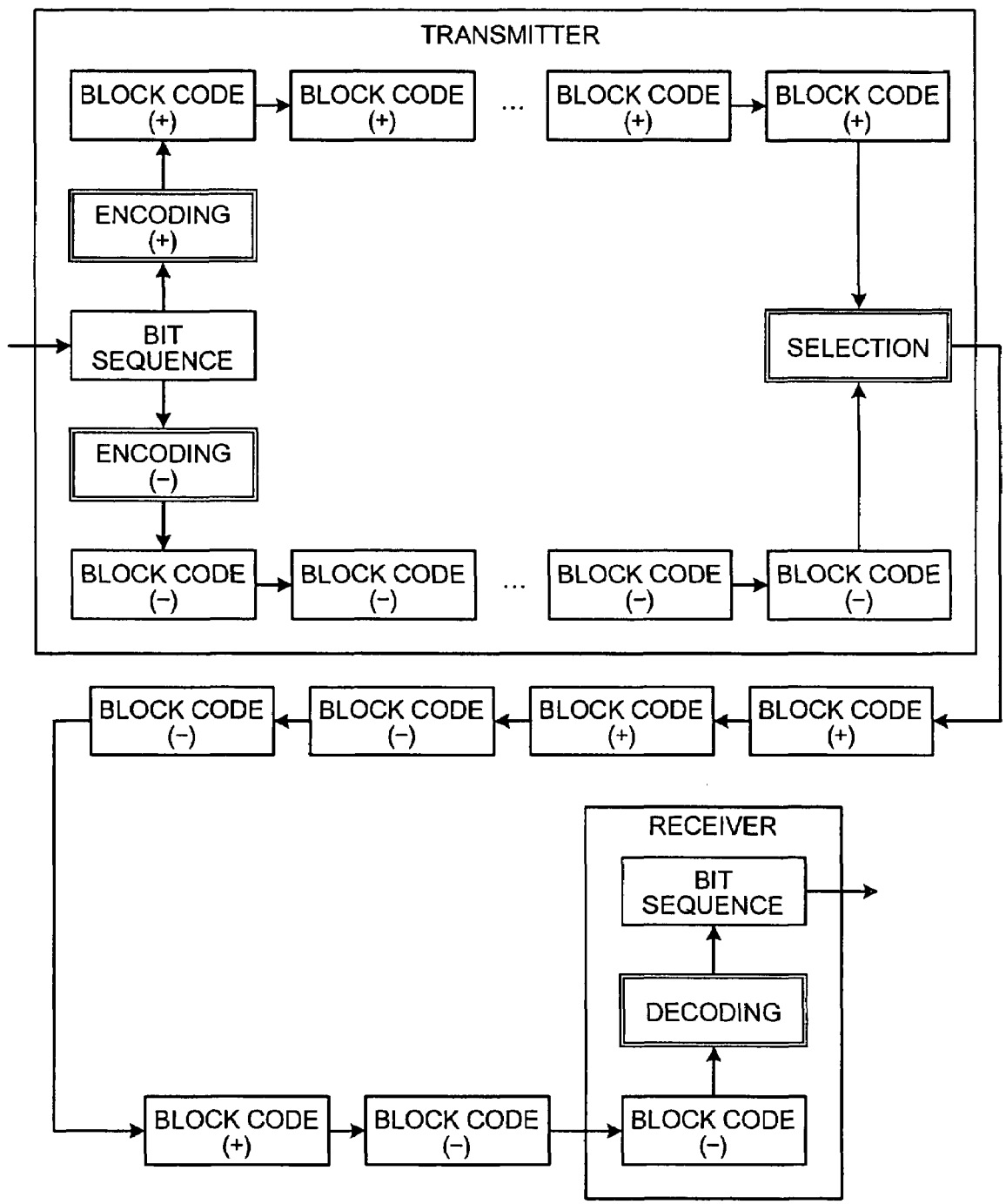
FIG. 21 is a schematic for explaining an outline of backplane transmission according to a fourth embodiment of the present invention.

As shown in FIG. 21, in the backplane transmission according to the fourth embodiment, each bit sequence is block encoded using both plus encoding and minus encoding and the block code that generates a smaller reflected wave is transmitted to the receiving board. Determining the block code that generates a smaller reflected wave is based on the analysis result of the waveforms of the reflected waves, the block codes that are already transmitted, and the block code for transmission.

Figure 22:
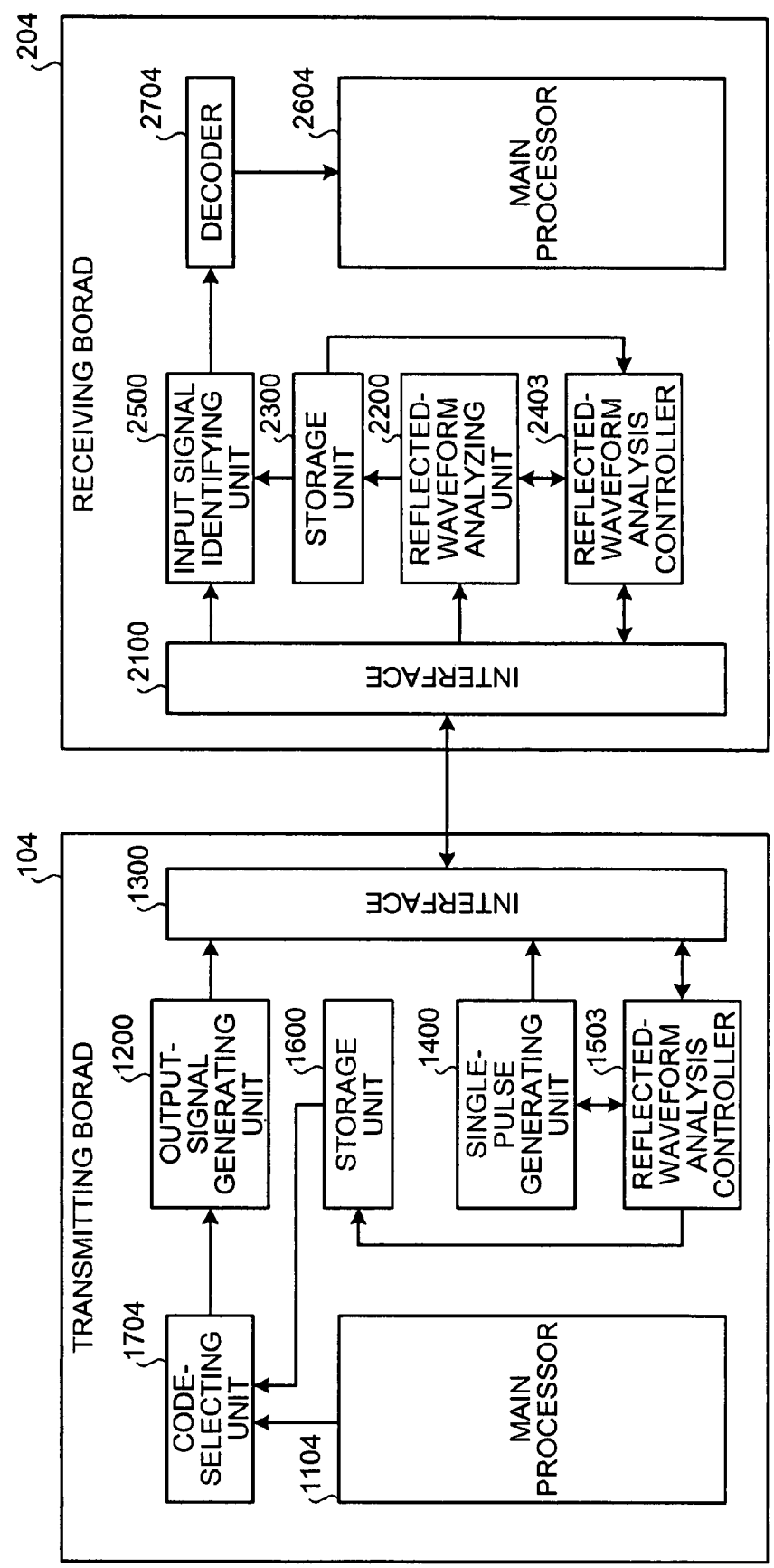
FIG. 22 is a functional block diagram of printed circuit boards according to the fourth embodiment.

FIG. 22 is a functional block diagram of printed circuit boards 104 and 204 according to the fourth embodiment. The backplane is not shown in FIG. 22.

The transmitting board 104 transmits data to the other printed circuit board by backplane transmission. The transmitting board 104 includes a main processor 1104, the output-signal generating unit 1200, the interface 1300, the single-pulse generating unit 1400, the reflected-waveform analysis controller 1503, the storage unit 1600, and a code-selecting unit 1704.

Because the output-signal generating unit 1200, the interface 1300, the single-pulse generating unit 1400, the reflected-waveform analysis controller 1503, and the storage unit 1600 are already explained, the same explanation is not repeated.

The main processor 1104 realizes essential functions of the transmitting board 104. The main processor 1104 carries out block encoding of data for transmission to the other printed circuit board using a normal method and outputs the block-encoded data to the code-selecting unit 1704. In other words, the main processor 1104 block encodes the bit sequence using alternate plus encoding and minus encoding, and outputs the block encoded bit sequence to the code-selecting unit 1704.

The code-selecting unit 1704 generates a block code having reversed codes for each block code that is input from the main processor 1104. From the plus block code and the minus block code, the code-selecting unit 1704 selects the block code that generates a smaller reflected wave and outputs the selected block code to the output-signal generating unit 1200.

The receiving board 204 receives data from the other printed circuit board by backplane transmission and includes the interface 2100, the reflected-waveform analyzing unit 2200, the storage unit 2300, the reflected-waveform analysis controller 2403, the input signal identifying unit 2500, a main processor 2604, and a decoder 2704.

Because the interface 2100, the reflected-waveform analyzing unit 2200, the storage unit 2300, the reflected-waveform analysis controller 2403, and the input signal identifying unit 2500 are already explained, the same explanation is not repeated.

The main processor 2604 realizes essential functions of the receiving board 204. The main processor 2604 receives from the other printed circuit board data that is block encoded by the normal method and decodes the data to execute various processes. To prevent the main processor 2604 from carrying out an abnormal operation, the decoder 2704 reencodes the block code that is transmitted from the transmitting board 104 such that the plus code and the minus code are alternated.

Figure 23:
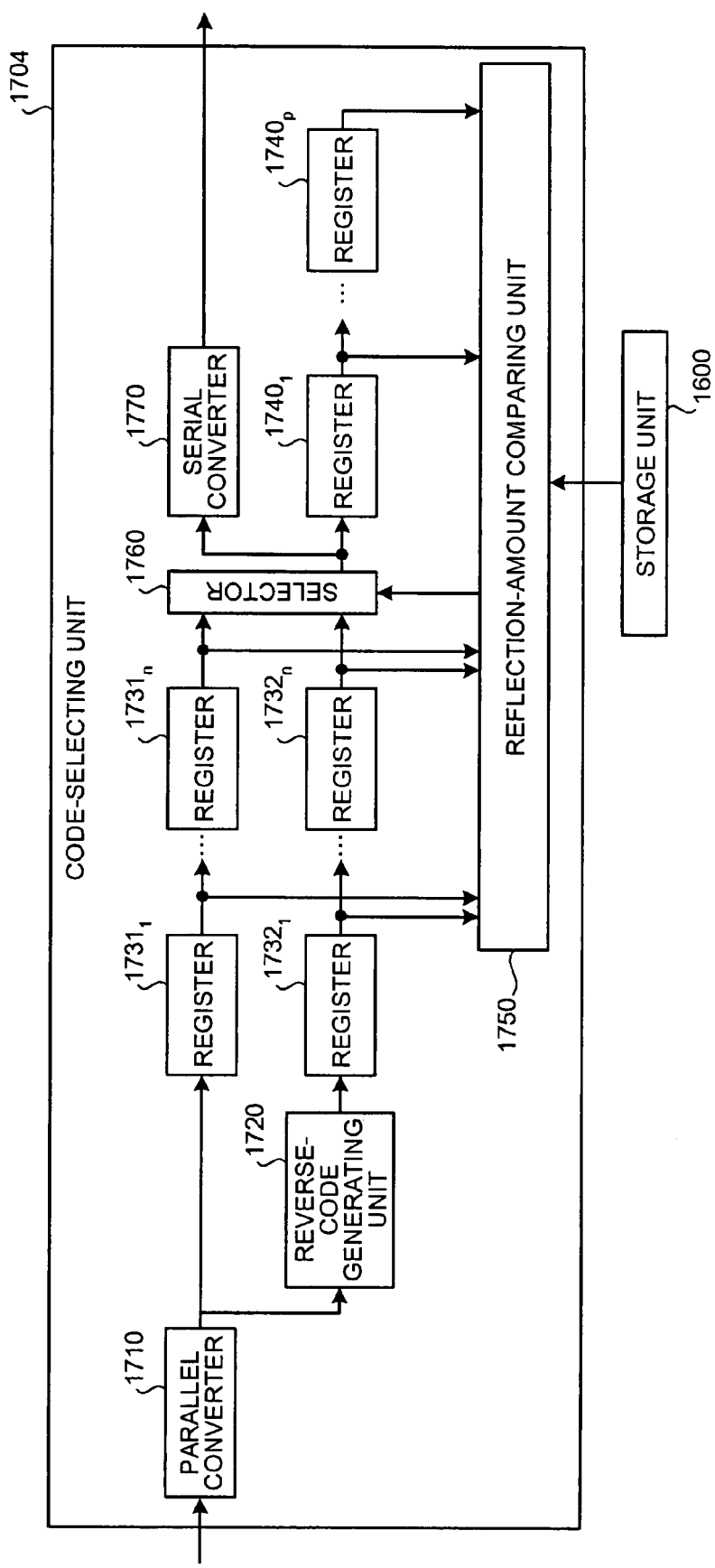
FIG. 23 is a functional block diagram of a code-selecting unit shown in FIG. 22.

FIG. 23 is a functional block diagram of the code-selecting unit 1704. The code-selecting unit 1704 includes a parallel converter 1710, a reverse-code generating unit 1720, registers $1731_1$ to $1731_n$, $1732_1$ to $1732_n$, and $1740_1$ to $1740_p$, a reflection-amount comparing unit 1750, a selector 1760, and a serial converter 1770.

For enabling to collectively deal with the bits in the same block code, the parallel converter 1710 converts serial signals into parallel signals with a width corresponding to the length of the block code. The reverse-code generating unit 1720 converts the block code indicated by the signals that are paralleled by the parallel converter 1710 and generates a block code such that the plus code and the minus code are reversed.

Among the signals that are paralleled by the parallel converter 1710, in other words, from the block code not reversed, the registers $1731_1$ to $1731_n$ maintain signals that await transmission. From the block code reversed by the reverse-code generating unit 1720, the registers $1732_1$ to $1732_n$ maintain the signals that await transmission. Among the plus block code and the minus block code that represent the same bit sequence, the registers $1740_1$ to $1740_p$ maintain the signals transmitted to the receiver.

The reflection-amount comparing unit 1750 compares the size of the reflected wave that is generated upon transmission of the unreversed block code maintained by the register $1731_n$ with the size of the reflected wave generated upon transmission of the reversed block code maintained by the register $1732_n$. The reflection-amount comparing unit 1750 notifies the selector 1760 of the block code that generates a smaller reflected wave. For obtaining the sizes of the reflected waves, the reflection-amount comparing unit 1750 refers to the registers $1731_1$ to $1731_n$, $1732_1$ to $1732_n$, $1740_1$ to $1740_p$, and the storage unit 1600.

According to the notification from the reflection-amount comparing unit 1750, the selector 1760 outputs to the register $1740_l$ and the serial converter 1770, the block code that generates the reflected wave of smaller size among the block code maintained in the register $1731_n$ and the block code maintained in the register $1732_n$. The serial converter 1770 converts the block code into serial signals and outputs the serial signals.

Figure 24:
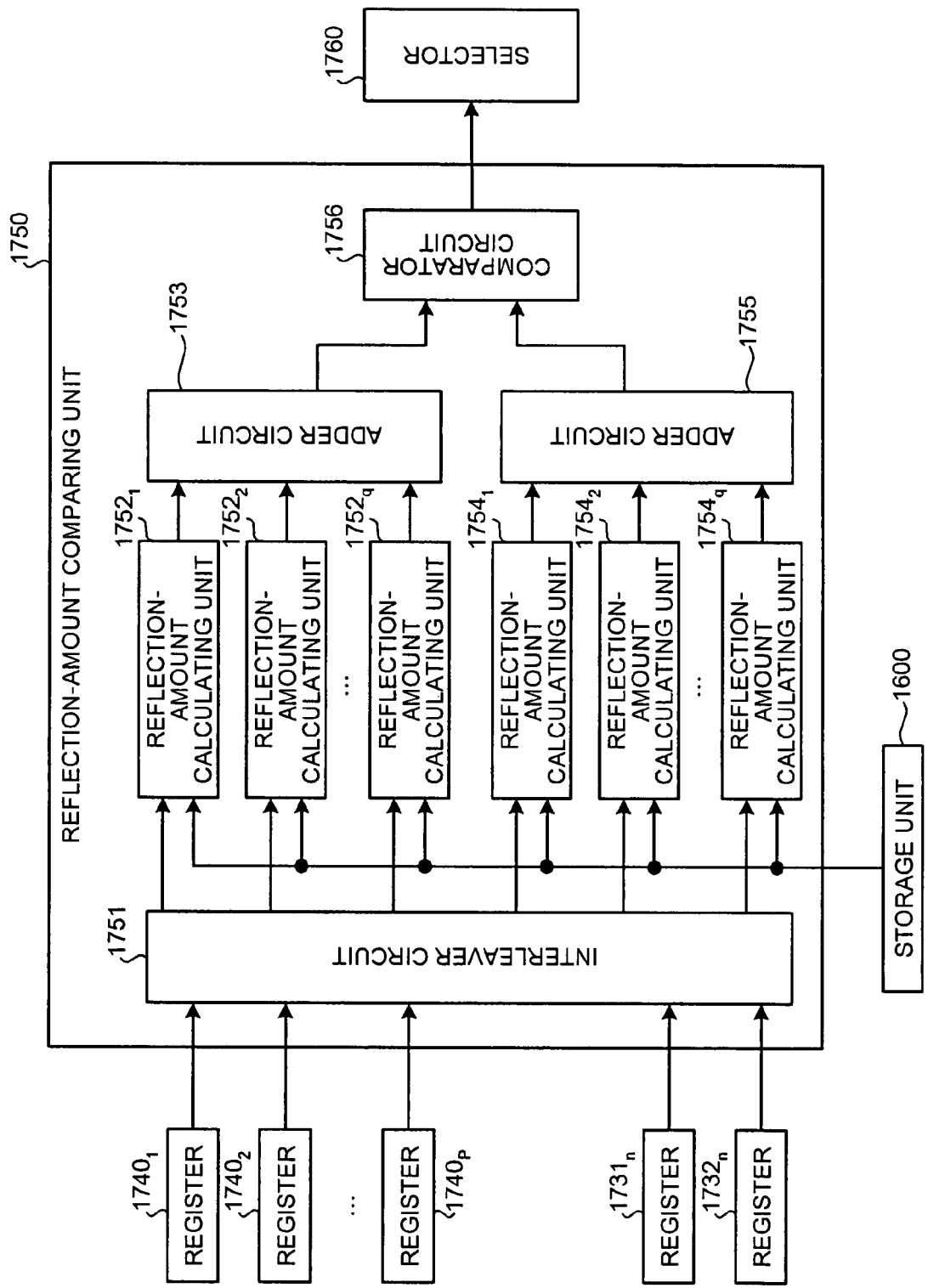
FIG. 24 is a functional block diagram of a reflection-amount comparing unit shown in FIG. 23.

FIG. 24 is a functional block diagram of the reflection-amount comparing unit 1750. The reflection-amount comparing unit 1750 includes an interleaver circuit 1751, reflection-amount calculating units $1752_1$ to $1752_q$, an adder circuit 1753, reflection-amount calculating units $1754_1$ to $1754_q$, an adder circuit 1755, and a comparator circuit 1756.

The interleaver circuit 1751 enables the reflection-amount calculating units $1752_1$ to $1752_q$ and $1754_1$ to $1754_q$ to access as a bit sequence arranged in a time series, the bits that are distributed in the registers $1740_1$ to $1740_p$, $1731_n$, and $1732_n$.

The reflection-amount calculating units $1752_1$ to $1752_q$ calculate the sizes of the reflected waves that are generated upon transmission of the bits from the register $1731_n$. The structure of the reflection-amount calculating units $1752_1$ to $1752_q$ is similar to the structure of the reflection-amount calculating unit 2520 shown in FIG. 11. To be specific, the reflection-amount calculating unit $1752_1$ calculates the size of the reflected wave that is generated upon transmission of the first bit from the register $1731_n$. The reflection-amount calculating unit $1752_q$ calculates the size of the reflected wave that is generated upon transmission of the qth bit from the register $1731_n$.

The adder circuit 1753 adds calculation results of the reflection-amount calculating units $1752_1$ to $1752_q$ and calculates a sum of the sizes of the reflected waves generated upon transmission of the block code that is maintained in the register $1731_n$.

The reflection-amount calculating units $1754_1$ to $1754_q$ calculate the sizes of the reflected waves that are generated upon transmission of the bits from the register $1732_n$. The structure of the reflection-amount calculating units $1754_1$ to $1754_q$ is similar to the structure of the reflection-amount calculating unit 2520 shown in FIG. 11. To be specific, the reflection-amount calculating unit $1754_1$ calculates the size of the reflected wave that is generated upon transmission of the first bit from the register $1732_n$. The reflection-amount calculating unit $1752_q$ calculates the size of the reflected wave that is generated upon transmission of the qth bit from the register $1732_n$.

The adder circuit 1755 adds calculation results of the reflection-amount calculating units $1754_1$ to $1754_q$ and calculates a sum of the sizes of the reflected waves generated upon transmission of the block code that is maintained in the register $1732_n$.

The comparing unit 1756 compares the calculation results of the adder circuits 1753 and 1755 and notifies the selector 1760 of the block code that generates the reflected wave of smaller size upon transmission of the block code maintained in the register $1731_n$ and transmission of the block code maintained in the register $1732_n$.

In the example explained with reference to FIGS. 20 and 21, the size of the reflected wave is used as the standard to determine whether to transmit the plus block code or the minus block code. However, for curbing growth of the reflected wave, the block code, which generates a smaller maximum height of the waveform resulting due to overlapping of the reflected wave and the direct wave can also be transmitted. Moreover, for reducing the number of the remaining reflected waves when transmitting subsequent data, the block code having a large number of "0" bits can also be transmitted.

In the example explained with reference to FIGS. 20 and 21, the sizes of the reflected waves are compared without considering the subsequent block codes that are maintained in the registers $1731_1$ to $1731_{n-1}$ and $1732_1$ to $1732_{n-1}$. However, transmission of the subsequent block codes in appropriate combinations that enable maximum reduction in the size of the reflected waves can be simulated and based on a result of the simulation, the block codes for transmission can be selected.

Figure 25:
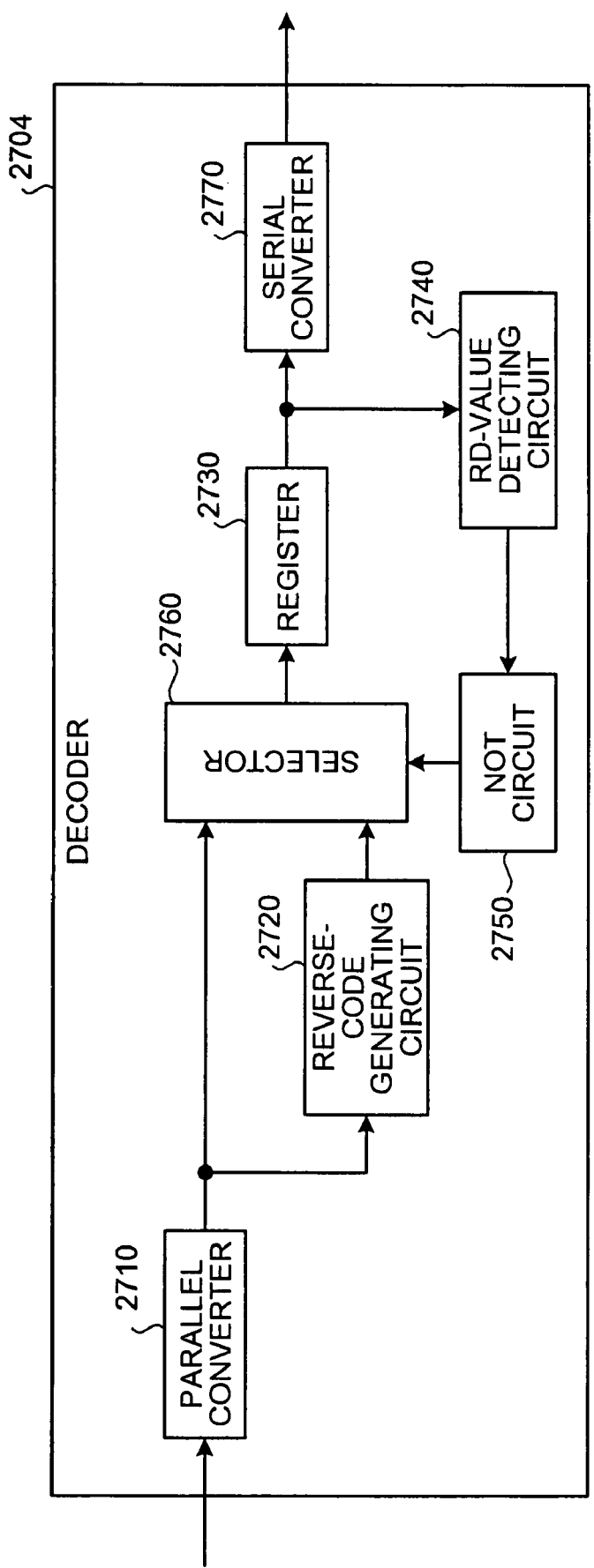
FIG. 25 is a functional block diagram of a decoder shown in FIG. 22.

FIG. 25 is a functional block diagram of the decoder 2704. The decoder 2704 includes a parallel converter 2710, a reverse-code generating circuit 2720, a register 2730, an RD-value detecting circuit 2740, a NOT circuit 2750, a selector 2760, and a serial converter 2770.

For enabling to collectively deal with the bits in the same block code, the parallel converter 2710 converts the serial signals into parallel signals with a width corresponding to the length of the block code. The reverse-code generating circuit 2720 converts the block code indicated by the signals that are paralleled by the parallel converter 2710 and generates a block code such that the plus code and the minus code are reversed.

Among the plus block code and the minus block code that represent the same byte string, the register 2730 maintains the block code that is selected by the selector 2760. The RD-value detecting circuit 2740 detects whether the block code maintained in the register 2730 is the plus block code or the minus block code. The NOT circuit 2750 inverts a detection result of the RD-value detecting circuit 2740.

According to a notification from the NOT circuit 2750, among the block code that is paralleled by the parallel converter 2710 and the block code that is reversed by the reverse-code generating circuit 2720, the selector 2760 selects the block code having the plus code and the minus code that are reversed with respect to the block code that is maintained in the register 2730, and outputs the selected block code to the register 2730. The serial converter 2770 converts into serial signals the block code that is maintained in the register 2730 and outputs the serial signals.

In the backplane transmission according to the fourth embodiment, among the block codes that represent the same bit sequence, the block code that generates the reflected wave of a smaller size is transmitted. Thus, growth of the reflected wave can be curbed.

Using the existing block code to curb growth of the reflected wave is explained in the fourth embodiment. However, using a block code that includes a unique specification is highly effective in curbing growth of the reflected wave. Using the block code that includes the unique specification to curb growth of the reflected wave is explained in a fifth embodiment of the present invention.

Figure 26:
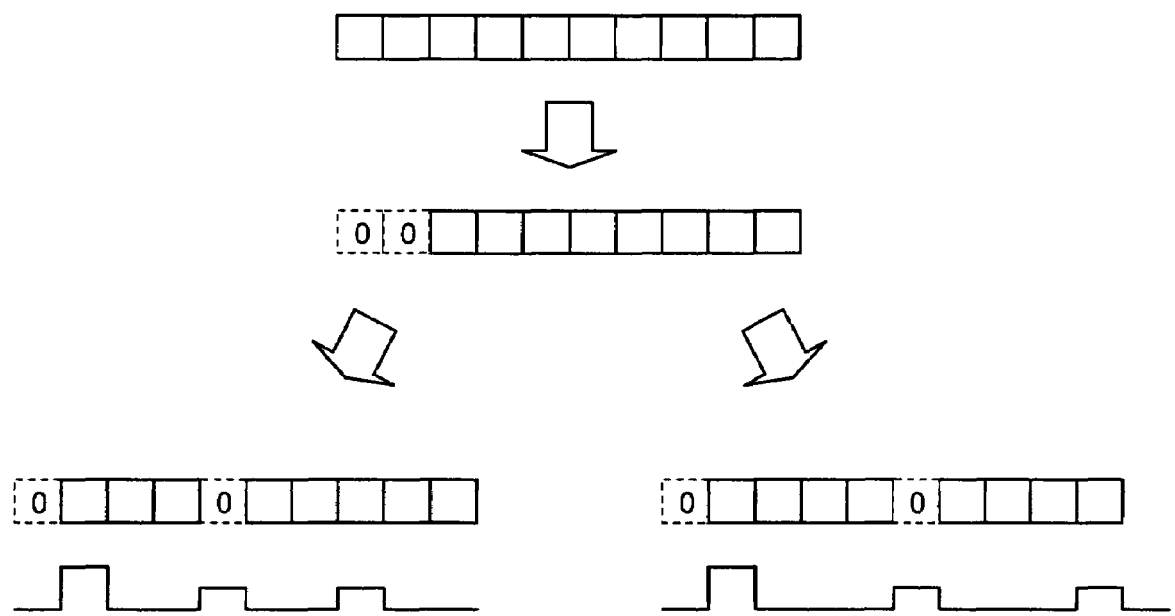
FIG. 26 is a schematic for explaining an outline of backplane transmission according to a fifth embodiment of the present invention.

An outline of a backplane transmission according to the fifth embodiment is explained first. FIG. 26 is a schematic for explaining the outline of the backplane transmission according to the fifth embodiment. As shown in FIG. 26, upon decoding data that is encoded by 8B/10B codes, 10-bit data is decoded to 8-bit data resulting in a 2-bit margin.

In the backplane transmission according to the fifth embodiment, the margin that is created upon decoding the block-encoded data is used to embed "0" bits into positions effective in curbing growth of the reflected wave.

For example, when a reflected wave appears in a 3-bit cycle, if "0" bits are embedded in the first bit and the fifth bit, the reflected wave ceases to grow even if the second bit is "1". When the reflected wave appears in a 4-bit cycle, if "0" bits are embedded in the first bit and the sixth bit, the reflected wave ceases to grow even if the second bit is "1".

However, logic for determining the positions to embed "0" bits is not limited to the logic mentioned earlier, and any logic can also be randomly used.

Figure 27:
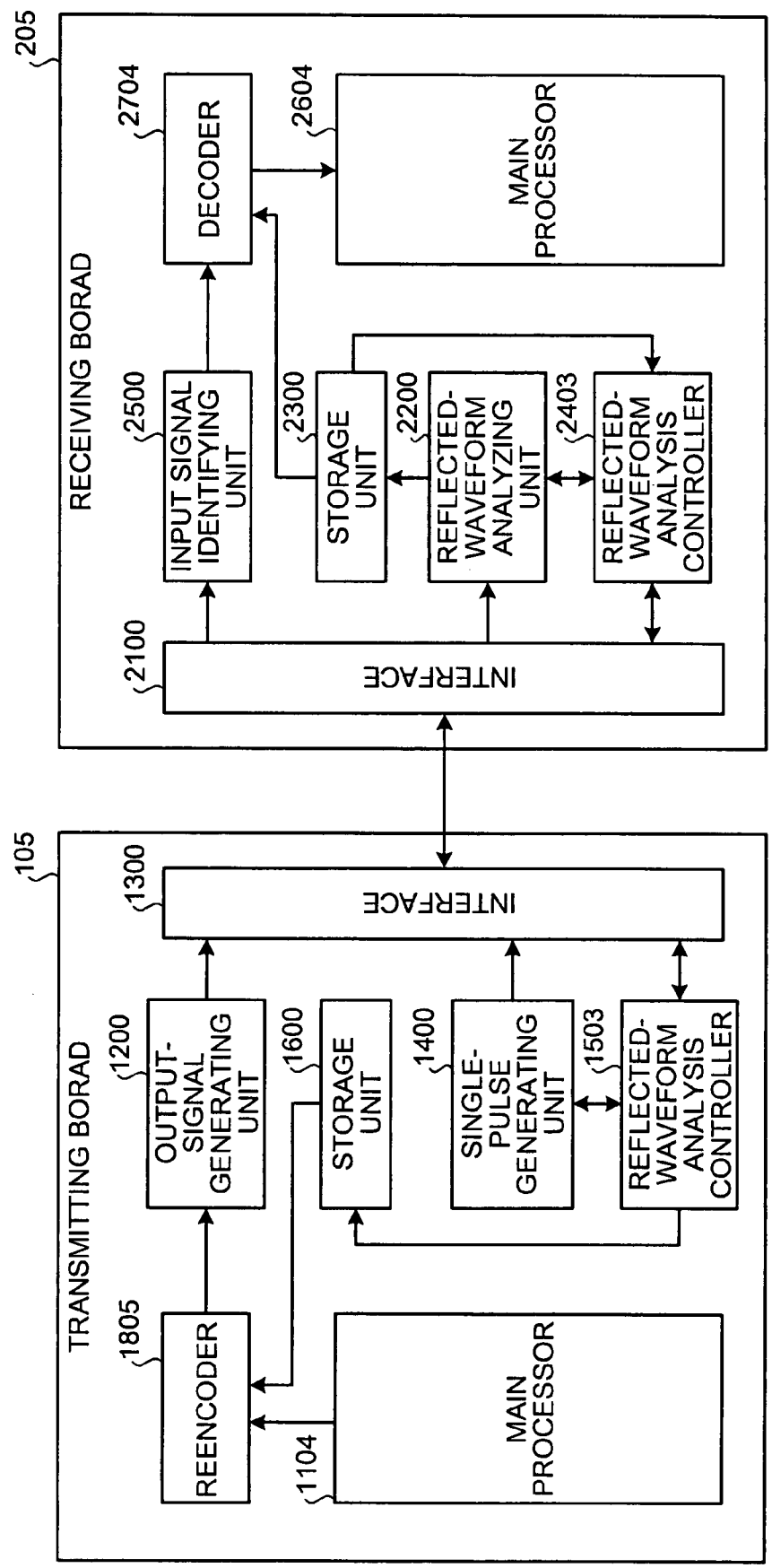
FIG. 27 is a functional block diagram of printed circuit boards according to the fifth embodiment.

FIG. 27 is a functional block diagram of printed circuit boards 105 and 205 according to the fifth embodiment. The backplane is not shown in FIG. 27.

The transmitting board 105 transmits data to the other printed circuit board by backplane transmission. The transmitting board 105 includes the main processor 1104, the output-signal generating unit 1200, the interface 1300, the single-pulse generating unit 1400, the reflected-waveform analysis controller 1503, the storage unit 1600, and a reencoder 1805.

Because the main processor 1104, the output-signal generating unit 1200, the interface 1300, the single-pulse generating unit 1400, the reflected-waveform analysis controller 1503, and the storage unit 1600 are already explained, the same explanation is not repeated.

The reencoder 1805 decodes the block code that is input from the main processor 1104, embeds into predetermined positions "0" bits corresponding to the created bit margin, and outputs the decoded block code to the output-signal generating unit 1200.

The receiving board 205 receives data from the other printed circuit board by backplane transmission. The receiving board 205 includes the interface 2100, the reflected-waveform analyzing unit 2200, the storage unit 2300, the reflected-waveform analysis controller 2403, the input signal identifying unit 2500, the main processor 2604, and a decoder 2805.

Because the interface 2100, the reflected-waveform analyzing unit 2200, the storage unit 2300, the reflected-waveform analysis controller 2403, the input signal identifying unit 2500, and the main processor 2604 are already explained, the same explanation is not repeated.

The decoder 2805 removes the "0" bits that are embedded by the reencoder 1805, carries out reencoding to restore the block code, and outputs the block code to the main processor 2604.

Figure 28:
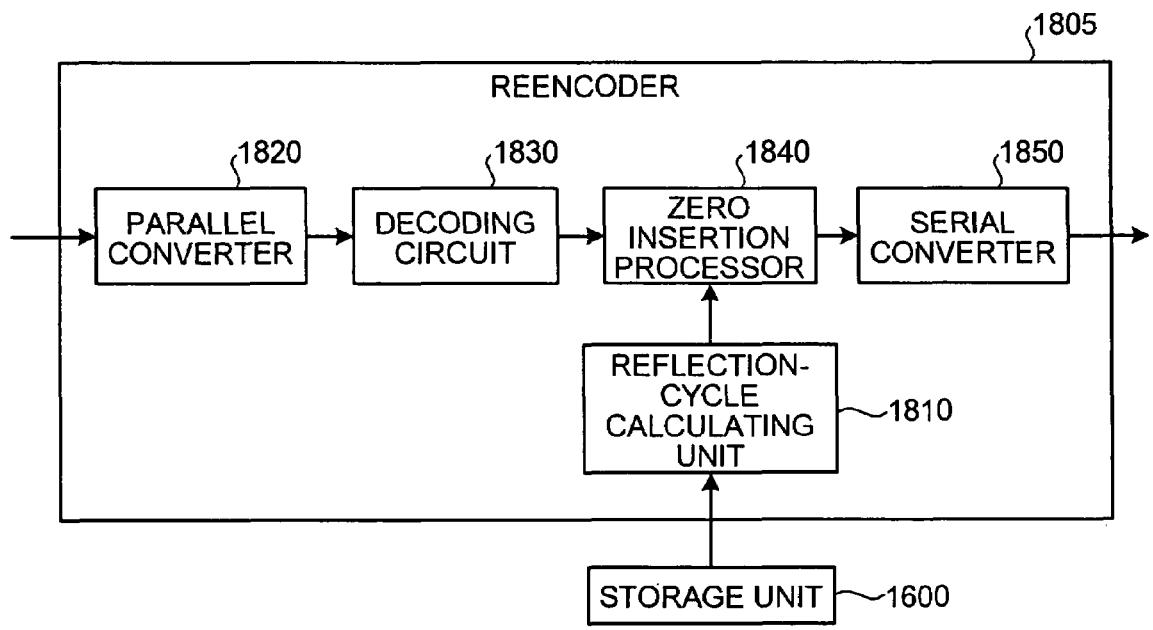
FIG. 28 is a functional block diagram of a reencoder shown in FIG. 27.

FIG. 28 is a functional block diagram of the reencoder 1805. The reencoder 1805 includes a reflection-cycle calculating unit 1810, a parallel converter 1820, a decoding circuit 1830, a zero insertion processor 1840, and a serial converter 1850.

Based on the waveform data of the reflected wave that is stored in the storage unit 1600, the reflection-cycle calculating unit 1810 calculates a cycle of the reflected wave. For enabling to collectively deal with the bits in the same block code, the parallel converter 1820 converts the serial signals into parallel signals with a width corresponding to the length of the block code. The decoding circuit 1830 decodes the block code indicated by the signals that are paralleled by the parallel converter 1820.

The zero insertion processor 1840 inserts "0" bits in the positions that are determined based on the cycle of the reflected wave that is calculated by the reflection-cycle calculating unit 1810. The serial converter 1850 converts into serial signals, data that includes "0" bits inserted by the zero insertion processor 1840 and outputs the serial signals.

Figure 29:
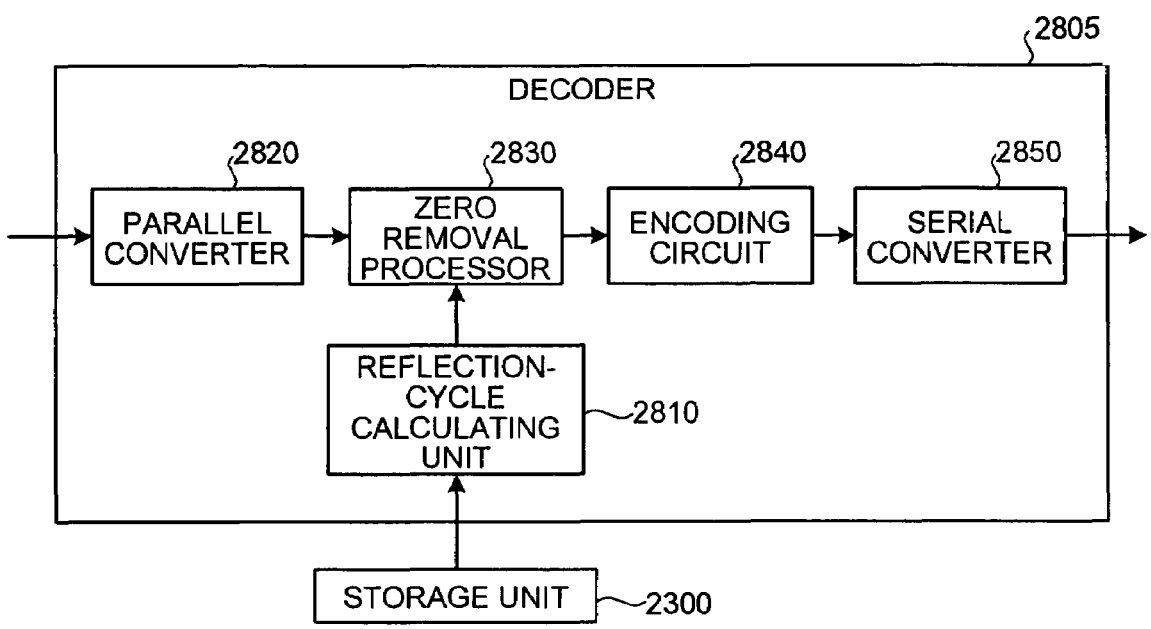
FIG. 29 is a functional block diagram of a decoder shown in FIG. 27.

FIG. 29 is a functional block diagram of the decoder 2805. The decoder 2805 includes a reflection-cycle calculating unit 2810, a parallel converter 2820, a zero removal processor 2830, an encoding circuit 2840, and a serial converter 2850.

Based on the waveform data that is stored in the storage unit 2300, the reflection-cycle calculating unit 2810 calculates the cycle of the reflected wave. For enabling to collectively deal with the bits in the same block code, the parallel converter 2820 converts the serial signals into parallel signals with a width corresponding to the length of the block code.

The zero removal processor 2830 specifies the positions of "0" bits inserted by the zero insertion processor 1840 based on the cycle of the reflected wave calculated by the reflection-cycle calculating unit 2810, and restores to a state before bit insertion, the data indicated by the signals that are paralleled by the parallel converter 2820.

The encoding circuit 2840 carries out encoding to restore to the block code, the data that is restored by the zero removal processor 2830. The serial converter 2850 converts into serial signals the data that is restored to the block code and outputs the serial signals.

In the backplane transmission according to the fifth embodiment, the block-encoded data is decoded, and "0" bits corresponding to the resulting bit margin are inserted in the decoded data at the positions effective in reducing the reflected wave to transmit the data. Thus, the reflected wave can be effectively reduced compared to when the already existing block code is used.

The structures of the devices indicated in the embodiments can be randomly integrated. For example, combining the structures indicated in the fourth or the fifth embodiments with the structures indicated in the first or the second embodiments enables to significantly reduce influence of the reflected wave and to realize extremely high-speed backplane transmission.

As set forth hereinabove, according to an embodiment of the present invention, based on waveform data acquired by previously analyzing a reflected wave, a size of the reflected wave is estimated and signals are identified considering the estimated size. Thus, data transmission can be accurately performed without influence of the reflected wave.

Moreover, according to another embodiment of the present invention, the reflected wave is analyzed at the time a printed circuit board is mounted on a backplane. Thus, analysis of the reflected wave can be performed without a load on a transmission line or the like.

Furthermore, according to still another embodiment of the present invention, the reflected wave is analyzed every time before the exchange of data is started. Thus, even if characteristics of the reflected wave change frequently due to a change in environment, data transmission can be accurately performed based on the latest analysis result of the reflected wave.

Moreover, according to still another embodiment of the present invention, instead of changing a threshold value according to the estimated size of the reflected wave, a combination of a plurality of fixed threshold values and a selecting operation is used to identify the signals while considering the influence of the reflected wave. Thus, high-speed data transmission can be realized.

Furthermore, according to still another embodiment of the present invention, based on the waveform data, the size of the reflected wave is estimated and an output level is adjusted on the transmitting side. Thus, data transmission can be accurately performed without influence of the reflected wave. Further, growth of the reflected wave can be curbed.

Moreover, according to still another embodiment of the present invention, a signal of a single waveform is generated as a signal for analyzing the reflected wave. Thus, the reflected wave can be accurately analyzed.

Furthermore, according to still another embodiment of the present invention, among a plurality of codes that represent the same bit sequence, a code that generates the smallest reflected wave is selected and transmitted. Thus, influence of the reflected wave during data transmission can be reduced.

Moreover, according to still another embodiment of the present invention, data is transmitted by inserting "0" bits in predetermined positions depending on a cycle of the reflected wave. Thus, growth of the reflected wave can be prevented.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A printed circuit board on a backplane that exchanges signals with another printed circuit board on the backplane via a transmission line, the printed circuit board comprising:
   an analyzing unit that analyzes a reflected wave generated in the transmission line along with transmission of a signal from the other printed circuit board and obtains waveform data that indicates a waveform of the reflected wave;
   a calculating unit that calculates a size of the reflected wave based on the waveform data and data on previously received signals; and
   an identifying unit that corrects a threshold value by calculated size of the reflected wave and identifies a state of a bit indicated by the signal from the other printed circuit board.

2. The printed circuit board according to claim 1, wherein the analyzing unit analyzes the reflected wave upon the other printed circuit board being mounted on the backplane.

3. The printed circuit board according to claim 1, wherein the analyzing unit analyzes the reflected wave before starting exchange of data with the other printed circuit board via the transmission line.

4. The printed circuit board according to claim 1, wherein the identifying unit includes a plurality of identifying units that identify the state of the bit based on a predetermined threshold value uniquely assigned to each of the identifying units, the printed circuit board further comprising:
   a selector that selects, as an authentic state of the bit, the state of the bit identified by one of the identifying units assigned a threshold value corresponding to the calculated size of the reflected wave.

5. A backplane data transmission method for exchange of signals between a first printed circuit board and a second printed circuit board via transmission line on a backplane, the backplane data transmission method comprising:
   the first printed circuit board transmitting a signal of a single waveform to the second printed circuit board via the transmission line;
   the second printed circuit board analyzing a reflected wave generated in the transmission line along with the transmission of the signal to obtain waveform data that indicates a waveform of the reflected wave;
   the second printed circuit board calculating a size of the reflected wave based on the waveform data and data on previously received signals;
   the second printed circuit board correcting a threshold value by calculated size of the reflected wave; and
   the second printed circuit board identifying a state of a bit indicated by the signal transmitted from the first printed circuit board.

* * * * *